(12) United States Patent
Shao et al.

(10) Patent No.: US 11,386,350 B2
(45) Date of Patent: Jul. 12, 2022

(54) MODEL PARAMETER COMBINATION METHOD AND APPARATUS

(71) Applicant: HUAWEI TECHNOLOGIES CO., LTD., Shenzhen (CN)

(72) Inventors: Yunfeng Shao, Shenzhen (CN); Jun Xu, Hangzhou (CN); Masood Mortazavi, Santa Clara, CA (US)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 1078 days.

(21) Appl. No.: 15/980,866

(22) Filed: May 16, 2018

(65) Prior Publication Data

US 2018/0260739 A1 Sep. 13, 2018

Related U.S. Application Data

(63) Continuation of application No. PCT/CN2015/094722, filed on Nov. 16, 2015.

(51) Int. Cl.
*G06N 20/00* (2019.01)
*G06F 30/00* (2020.01)
(Continued)

(52) U.S. Cl.
CPC ........... *G06N 20/00* (2019.01); *G06F 3/0646* (2013.01); *G06F 30/00* (2020.01); *G06N 3/04* (2013.01); *G06N 3/082* (2013.01); *H04L 41/16* (2013.01)

(58) Field of Classification Search
CPC .......... H04L 41/16; G06N 3/04; G06N 3/082; G06N 20/00; G06F 30/00; G06F 3/0646
See application file for complete search history.

(56) References Cited

U.S. PATENT DOCUMENTS

2012/0102175 A1 4/2012 Ito
2013/0282639 A1 10/2013 Potkonjak
(Continued)

FOREIGN PATENT DOCUMENTS

CN 104463324 A 3/2015
CN 104463424 A 3/2015
(Continued)

OTHER PUBLICATIONS

Yan, Zhengtong and Yunfeng Shao. "Asynchronous Distributed Data Parallelism for Machine Learning." (2015). (Year: 2015).*
(Continued)

*Primary Examiner* — Nicholas P Celani
(74) *Attorney, Agent, or Firm* — Maier & Maier, PLLC

(57) ABSTRACT

The method and apparatus that are applied to a machine learning system which includes at least one parameter collection group and at least one parameter delivery group. Each parameter collection group is corresponding to at least one parameter delivery group. The method includes: when any parameter collection group meets an intra-group combination condition, combining model parameters of M nodes in the parameter collection group to obtain a first model parameter of the parameter collection group, where a smallest quantity s of combination nodes in the parameter collection group≤M≤a total quantity of nodes included in the parameter collection group; and sending the first model parameter of the parameter collection group to N nodes in a parameter delivery group corresponding to the parameter collection group, where 1≤N≤a total quantity of nodes included in the parameter delivery group corresponding to the parameter collection group.

24 Claims, 6 Drawing Sheets

(51) Int. Cl.
  *G06N 3/08*     (2006.01)
  *G06N 3/04*     (2006.01)
  *G06F 3/06*     (2006.01)
  *H04L 41/16*    (2022.01)

(56) References Cited

U.S. PATENT DOCUMENTS

2013/0290223 A1    10/2013  Chapelle et al.
2018/0267927 A1*   9/2018   Xu .......................... G06F 16/00

FOREIGN PATENT DOCUMENTS

| CN | 104699894 A | 6/2015 |
| CN | 104834709 A | 8/2015 |
| WO | 2011129819 A1 | 10/2011 |

OTHER PUBLICATIONS

Wang Yang et al, Multiple Rank Aggregation Based on Directly Optimizing Performance Measure. Chinese Journal of Computers, vol. 37, No. 8, Aug. 2014, 11 pages.
Sebastian Riedel et al., Model Combination for Event Extraction in BioNLP 2011. Proceedings of the BioNLP Shared Tasks 2011 workshp, Dec. 31, 2011, 5 pages.
Wang Yang et al., Multiple Rank Aggregation Based on Directly Optimizing Performance Measure, Chinese Journal of Computers, vol. 37, No. 8, Aug. 2014. with English abstract, total 11 pages.

* cited by examiner

MODEL PARAMETER COMBINATION METHOD AND APPARATUS

CROSS-REFERENCE TO RELATED APPLICATIONS

This application is a continuation of International Application No. PCT/CN2015/094722, filed on Nov. 16, 2015, the disclosure of which is hereby incorporated by reference in its entirety.

TECHNICAL FIELD

The present invention relates to the machine learning field, and in particular, to a model parameter combination method and apparatus.

BACKGROUND

Model parameters refer to parameters that include multiple constraint parameters and describe a model. Data with a common feature may be obtained by means of screening by using the model parameters. For example, when the model parameters are image-type model parameters, image data of a person, an animal, or a human face may be obtained by means of screening from a large amount of image data by using different model parameters. With rapid growth in data volume and data types, more model parameters are used for data screening. However, the model parameters are obtained after a large amount of data with a common feature is calculated and combined for multiple times.

Currently, model parameter combination includes: dividing data into multiple data subsets, allocating the multiple data subsets to different nodes, training the allocated data subsets by using a data iteration calculation method, combining model parameters obtained by training different data subsets by the nodes after each one or more times of iteration calculation, using a combined model parameter as an initial model parameter for a next time of iteration calculation, and obtaining a final total model parameter after multiple times of combination.

In the prior art, there are mainly two model parameter combination methods. In a first method, after nodes complete multiple times of iteration calculation on multiple data subsets, a parameter server collects and combines model parameters obtained by training the multiple data subsets by the nodes, to obtain a new model parameter; then the nodes perform a next time of iteration calculation on the multiple data subsets according to the new model parameter. In a second method, when a node completes multiple times of iteration calculation on a data subset allocated to the node, the node sends, to another specified node, a model parameter obtained by training the allocated data subset by the node, so that the model parameter is combined with a model parameter of a data subset of the another node; then the node starts iteration calculation according to the model parameter that is transmitted by the another node after the another node trains the another data subset and that is received by the node. However, the first method has a relatively high performance requirement for a parameter server configured to perform model parameter combination, and is prone to cause a shutdown, and the second method requires more data to be stored and a large data transmission volume.

SUMMARY

Embodiments of the present invention provide a model parameter combination method and apparatus, so as to resolve a problem that model parameter combination has a high performance requirement for a parameter server, and a large data transmission volume.

To achieve the foregoing objective, the following technical solutions are used in the embodiments of the present invention:

A first aspect provides a model parameter combination method, where the method is applied to a machine learning system, the machine learning system includes at least one parameter collection group and at least one parameter delivery group, each parameter collection group is corresponding to at least one parameter delivery group, each parameter collection group includes at least one node, each parameter delivery group includes at least one node, a node included in the at least one parameter collection group is different from a node included in a corresponding parameter delivery group, and the method includes:

when any parameter collection group meets an intra-group combination condition, combining model parameters of M nodes in the parameter collection group that meets the condition, to obtain a first model parameter of the parameter collection group that meets the condition, where a smallest quantity s of combination nodes in the parameter collection group that meets the condition≤M≤a total quantity of nodes included in the parameter collection group that meets the condition; and sending, to N nodes in a parameter delivery group corresponding to the parameter collection group that meets the condition, the first model parameter of the parameter collection group that meets the condition, where 1≤N≤a total quantity of nodes included in the parameter delivery group corresponding to the parameter collection group that meets the condition, where the intra-group combination condition may be that a quantity of nodes in the parameter collection group that complete current model parameter iteration calculation reaches a preset value, that is, the smallest quantity s of combination nodes.

Specifically, when a quantity of nodes in any parameter collection group that complete current model parameter iteration calculation reaches the smallest quantity s of combination nodes, M nodes completing the current model parameter calculation are selected from the parameter collection group, and model parameters obtained by means of calculation by the M nodes are combined to obtain a first model parameter. Then, a parameter collection group is corresponding to a parameter delivery group, that is, one parameter collection group may be corresponding to one or more parameter delivery groups. Therefore, when the first model parameter of the parameter collection group is obtained by means of combination, if an intra-group delivery condition is met, the first model parameter may be sent, based on a correspondence between a parameter collection group and a parameter delivery group, to all nodes or some nodes in a corresponding parameter delivery group.

The intra-group delivery condition may be that a quantity of intra-group combination times reaches a preset quantity of times, or preset duration passes, or the like. This is not limited in the embodiments of the present invention.

Further, when the intra-group combination condition is met and the model parameters of the M nodes are combined, if the intra-group delivery condition is not met, the parameter collection group performs a new round of iteration calculation based on the first model parameter obtained by means of combination, and updates the first model parameter each time the model parameters of the M nodes are combined; or if the intra-group delivery condition is met, the first model parameter is delivered.

Further, when the first model parameter is sent to the parameter delivery group corresponding to the parameter collection group, address information of a node participating in combination of the first model parameter may also be sent to a node in the parameter delivery group. The address information may be an IP address of a node, a node number, or the like. This is not limited in the present invention.

It should be noted that the smallest quantity s of combination nodes, M, and N may be set in advance, s≤M≤the total quantity of nodes included in the parameter collection group that meets the condition, and 1≤N≤the total quantity of nodes included in the parameter delivery group corresponding to the parameter collection group that meets the condition.

In addition, that the node included in the at least one parameter collection group is different from the node included in the corresponding parameter delivery group indicates that nodes included in the at least one parameter collection group are not exactly the same as nodes included in the corresponding parameter delivery group, or may be that at least one node included in the parameter collection group is different from a node included in the parameter delivery group corresponding to the parameter collection group, or may be that all nodes included in the parameter collection group are different from all nodes included in the parameter delivery group corresponding to the parameter collection group.

With reference to the first aspect, in a first possible implementation manner of the first aspect, the combining model parameters of M nodes in the parameter collection group that meets the condition, to obtain a first model parameter of the parameter collection group that meets the condition includes:

receiving the model parameters of the M nodes that are sent by the M nodes completing iteration in the parameter collection group that meets the condition; and combining the received model parameters of the M nodes to obtain the first model parameter of the parameter collection group that meets the condition.

The method may be completed by a device independent of the parameter collection group, for example, a parameter server. A fixed node may serve as the parameter server. Specifically, the M nodes completing iteration in the parameter collection group separately send, to the parameter server, the model parameters obtained after the current iteration calculation. When the parameter server receives the model parameters sent by the M nodes, the parameter server may combine, in many different combination manners, the model parameters corresponding to the M nodes, to obtain the first model parameter.

For example, the many different combination manners may be as follows: The parameter server combines the model parameters corresponding to the M nodes at one time, to obtain the first model parameter; or after each node completes iteration, the node sends a parameter to the parameter server, and the parameter server receives parameters from nodes and combines the parameters, and performs a receiving and combination process for multiple times until combination of all the M nodes is completed, to obtain the first model parameter; or the like. This is not limited in the embodiments of the present invention.

It should be noted that a correspondence between the parameter server and each of the parameter collection group and the parameter delivery group corresponding to the parameter collection group may be set in advance.

With reference to the first aspect, in a second possible implementation manner of the first aspect, the combining model parameters of M nodes in the parameter collection group that meets the condition, to obtain a first model parameter of the parameter collection group that meets the condition includes:

obtaining node status information of the parameter collection group that meets the condition, where the node status information may include a node identifier and a sequence of a node completing iteration; and instructing, according to the node status information of the parameter collection group that meets the condition, the M nodes completing iteration in the parameter collection group that meets the condition, to combine the model parameters to obtain the first model parameter of the parameter collection group that meets the condition.

The method may be completed by a node in the parameter collection group. The node may be referred to as a control node. The control node may be specified in advance, or may be temporarily determined by means of recommendation by nodes in the parameter collection group. The control node may collect statistics on the node status information of the parameter collection group, and instruct to transmit and combine model parameters.

Specifically, when the control node instructs, according to the node status information of the parameter collection group, the M nodes completing iteration, to perform combination, the control node may instruct the M nodes completing iteration, to perform combination in different combination manners. For example, the control node may instruct the M nodes to send the corresponding model parameters to one node of the M nodes, so that the node performs combination for one time to obtain the first model parameter. Alternatively, the control node performs combination in the following third possible implementation manner of the first aspect to improve efficiency of obtaining the first model parameter by performing combination of the model parameters of the M nodes. Certainly, the control node may also perform combination in another combination manner. This is not limited in the embodiments of the present invention.

With reference to the second possible implementation manner of the first aspect, in a third possible implementation manner of the first aspect, the instructing, according to the node status information of the parameter collection group that meets the condition, the M nodes completing iteration in the parameter collection group that meets the condition, to combine the model parameters includes:

determining, according to the node status information of the parameter collection group that meets the condition, s nodes completing iteration from the parameter collection group; and instructing one node of the s nodes completing iteration, to combine model parameters of the s nodes.

That is, after determining the s nodes completing iteration in the parameter collection group, the control node instructs to use one node of the s nodes as a combination node, and another node separately sends, to the combination node, a model parameter obtained after the current iteration, so that the combination node combines the model parameters corresponding to the s nodes.

It should be noted that the combination node may be the last node completing iteration, or may be a node with the smallest node number. This is not limited in the embodiments of the present invention.

If a new node completes iteration in a process in which the combination node combines the model parameters corresponding to the s nodes, there may be two cases according to a value relationship between s and a quantity of new nodes.

In a first case, there are x new nodes, and when x<s, if the x new nodes complete iteration in the process in which the model parameters of the s nodes completing iteration are combined, one node of the x new nodes is instructed to combine model parameters of the x new nodes with a combined model parameter of the s nodes.

In a second case, there are y new nodes, and when y≥s, if the y new nodes complete iteration in the process in which the model parameters of the s nodes completing iteration are combined, one node of the y new nodes is instructed to combine model parameters of the y nodes, and then combine a combined model parameter of the y nodes with a combined model parameter of the s nodes.

It should be noted that after the foregoing two cases, if the M nodes have a remaining node that has not participated in combination, the remaining node may perform model parameter combination still by using the methods provided in the foregoing two cases, so as to improve efficiency of combining the model parameters of the M nodes. Certainly, combination may also be performed in another manner. This is not limited in the embodiments of the present invention.

In addition, one node of the new nodes may be a node with the smallest node number in the new nodes, or may be the last node completing iteration. This is not limited in the embodiments of the present invention.

With reference to any one of the first aspect to the third possible implementation manner of the first aspect, in a fourth possible implementation manner of the first aspect, the method further includes:

when W parameter collection groups meet an inter-group combination condition, separately combining all model parameters of nodes in each parameter collection group in the W parameter collection groups to obtain a second model parameter of each parameter collection group in the W parameter collection groups.

The W parameter collection groups are determined by upper-layer parameter collection groups of the W parameter collection groups, and W≤a total quantity of groups included in the upper-layer parameter collection groups.

In addition, the inter-group combination condition may be that a quantity of intra-group combination times of the parameter collection group reaches a preset quantity of times, or a specific time passes. Correspondingly, if the inter-group combination condition is that the quantity of intra-group combination times of the parameter collection group reaches the preset quantity of times, when a quantity of intra-group combination times of the W parameter collection groups reaches the preset quantity of times, for each parameter collection group in the W parameter collection groups, the parameter collection group may combine all current model parameters of all nodes in the group to obtain a second model parameter, so as to obtain the second model parameter of each parameter collection group in the W parameter collection groups.

For example, all nodes in each parameter collection group may send current model parameters to one node in the group, so that the node combines all the current model parameters of all the nodes to obtain a second model parameter. Certainly, overall combination may also be performed in another manner. This is not limited in the embodiments of the present invention.

Second model parameters of all parameter collection groups in the W parameter collection groups are combined to obtain a third model parameter; and the third model parameter is sent to nodes in the W parameter collection groups or to nodes in upper-layer parameter delivery groups of the W parameter collection groups.

The third model parameter may be sent to the nodes in the W parameter collection groups in a broadcast manner or in an iteration manner. That is, the last node completing combination separately sends the third model parameter to a node in a parameter collection group included in the W parameter collection groups, so that the node sequentially sends, in an iteration manner, the third model parameter to another node participating in inter-group combination.

Then, the third model parameter is sent to a node in a parameter delivery group corresponding to each parameter collection group in the W parameter collection groups. A sending manner may be a broadcast manner or an iteration manner.

The third model parameter may be sent to the nodes in the upper-layer parameter delivery groups of the W parameter collection groups in a broadcast manner or in an iteration manner. That is, the last node completing combination separately sends the third model parameter to first nodes in the upper-layer parameter delivery groups of the W parameter collection groups, and the nodes sequentially send the third model parameter to another node in the upper-layer parameter delivery groups in an iteration manner. The first nodes refer to nodes responsible for receiving the model parameters of the W parameter collection groups.

Then, the third model parameter is sent to a node in each lower-layer parameter delivery group in the upper-layer parameter delivery groups. A sending manner may be a broadcast manner or an iteration manner.

With reference to the fourth possible implementation manner of the first aspect, in a fifth possible implementation manner of the first aspect, the combining second model parameters of all parameter collection groups in the W parameter collection groups to obtain a third model parameter includes:

determining, from the W parameter collection groups, one node as an inter-group combination node; and separately selecting one node from another parameter collection group in the W parameter collection groups except a parameter collection group in which the inter-group combination node is located, to send a second model parameter of the corresponding parameter collection group to the inter-group combination node, so that the inter-group combination node combines the second model parameters of the W parameter collection groups to obtain the third model parameter.

It should be noted that the inter-group combination node may be a node recommended by all nodes in the W parameter collection groups, or the first node completing iteration, or a node with the smallest node number. This is not limited in the embodiments of the present invention.

When the node is separately selected from the another parameter collection group in the W parameter collection groups except the parameter collection group in which the inter-group combination node is located, a node responsible for overall combination may be selected from the parameter collection group.

In another embodiment, one node is separately determined from each parameter collection group in the W parameter collection groups, and the determined nodes are determined as a new parameter collection group; and when the new parameter collection group meets an intra-group combination condition, the second model parameters of the W parameter collection groups that meet the intra-group combination condition are combined to obtain the third model parameter.

It should be noted that the combining the second model parameters of the W parameter collection groups that meet the intra-group combination condition indicates combining the second model parameters of all the parameter collection groups in the W parameter collection groups.

In addition, when the node is determined from each parameter collection group in the W parameter collection groups, a node responsible for overall combination may be selected from each parameter collection group, or a node with the smallest number may be selected, or the like. This is not limited in the present invention.

Furthermore, a model parameter combination method for the new parameter collection group is similar to the foregoing intra-group combination method for the parameter collection group that meets the condition. Details are not described herein again in the present invention.

With reference to the first aspect, in a sixth possible implementation manner of the first aspect, the sending, to N nodes in a parameter delivery group corresponding to the parameter collection group that meets the condition, the first model parameter of the parameter collection group that meets the condition includes:

sending, in a broadcast manner to the nodes in the parameter delivery group corresponding to the parameter collection group that meets the condition, the first model parameter of the parameter collection group; or sending, to a first node in the parameter delivery group corresponding to the parameter collection group that meets the condition, the first model parameter of the parameter collection group that meets the condition, so that the first node sequentially sends, in an iteration manner to another node in the N nodes except the first node, the first model parameter of the parameter collection group that meets the condition.

With reference to any one of the first aspect to the sixth possible implementation manner of the first aspect, in a seventh possible implementation manner of the first aspect, the method further includes:

when a preset condition is met, regrouping nodes included in the parameter collection group and the parameter delivery group.

The preset condition may be that a specific time passes, or model parameter combination is completed for a specific quantity of times, or iteration is completed for a specific quantity of times, or the like. This is not limited in the embodiments of the present invention.

In addition, for the method for regrouping the nodes included in the parameter collection group and the parameter delivery group, a node grouping method provided in a second aspect of the present invention may be performed for regrouping. Details are not described herein in the present invention.

A second aspect provides a node grouping method applied to a machine learning system, where the machine learning system includes at least two nodes, and the method includes:

grouping the nodes in the machine learning system, so that the machine learning system includes at least one parameter collection group and at least one parameter delivery group, each parameter collection group is corresponding to at least one parameter delivery group, and a node included in the at least one parameter collection group is different from a node included in a parameter delivery group corresponding to the parameter collection group.

That each parameter collection group is corresponding to at least one parameter delivery group indicates that one parameter collection group may be corresponding to one parameter delivery group or may be corresponding to multiple parameter delivery groups.

In addition, that the node included in the parameter collection group is different from the node included in the parameter delivery group corresponding to the parameter collection group indicates that nodes included in the at least one parameter collection group are not exactly the same as nodes included in the corresponding parameter delivery group, or may indicate that at least one node included in the parameter collection group is different from a node included in the parameter delivery group corresponding to the parameter collection group, or may indicate that all nodes included in the parameter collection group are different from all nodes included in the parameter delivery group corresponding to the parameter collection group.

With reference to the second aspect, in a first possible implementation manner of the second aspect, different parameter collection groups have a same quantity of or different quantities of nodes; and/or different parameter delivery groups have a same quantity of or different quantities of nodes; and/or a quantity of nodes in a parameter collection group may be the same as or different from a quantity of nodes in a parameter delivery group corresponding to the parameter collection group.

With reference to the first possible implementation manner of the second aspect, in a second possible implementation manner of the second aspect, the machine learning system may further include a parameter server, a parameter collection group and a parameter delivery group corresponding to the parameter collection group are corresponding to a same parameter server, and different parameter collection groups and parameter delivery groups corresponding to the parameter collection groups are corresponding to different parameter servers.

With reference to the second possible implementation manner of the second aspect, the parameter server includes Y layers, one parameter server of the $(j+1)^{th}$ layer is corresponding to at least one parameter server of the $j^{th}$ layer, the parameter collection group and the parameter delivery group corresponding to the parameter collection group are corresponding to a parameter server of the first layer, and $1 \leq j < j+1 \leq Y$.

With reference to the second aspect, in a third possible implementation manner of the second aspect, the grouping the nodes in the machine learning system specifically includes:

establishing a correspondence between a node identifier and a node number;

determining a quantity of parameter collection groups and a quantity of parameter delivery groups;

determining the parameter collection group and the parameter delivery group based on the correspondence between a node identifier and a node number, the quantity of parameter collection groups, and the quantity of parameter delivery groups; and determining a correspondence between the parameter collection group and the parameter delivery group.

The node identifier is used to uniquely identify a node. For example, the node identifier may be an IP address of a node or a sequence code of a node. This is not limited in the present invention. The node number may be a sequence number randomly assigned to a node, or may be any value randomly assigned to a node, or the like. This is also not limited in the present invention.

When a preset condition is met, and regrouping is performed by using the node grouping method, a node number of each node may change, the quantity of parameter collection groups and the quantity of parameter delivery groups may change, and the correspondence between the parameter collection group and the parameter delivery group may also change correspondingly.

With reference to the third possible implementation manner of the second aspect, in a fourth possible implementation manner of the second aspect, the determining the parameter collection group and the parameter delivery group based on the correspondence between a node identifier and a node number, the quantity of parameter collection groups, and the quantity of parameter delivery groups includes:

dividing a node number corresponding to a node identifier by the quantity of parameter collection groups, to obtain a collection group remainder of a node;

dividing the node number corresponding to the node identifier by the quantity of parameter delivery groups, to obtain a delivery group remainder of the node; and determining nodes having a same collection group remainder as a same parameter collection group, and determining nodes having a same delivery group remainder as a same parameter delivery group.

A third aspect provides a model parameter combination apparatus, where the apparatus is applied to a machine learning system, the machine learning system includes at least one parameter collection group and at least one parameter delivery group, each parameter collection group is corresponding to at least one parameter delivery group, each parameter collection group includes at least one node, each parameter delivery group includes at least one node, a node included in the at least one parameter collection group is different from a node included in a corresponding parameter delivery group, and the apparatus includes:

a first combination unit, configured to: when any parameter collection group meets an intra-group combination condition, combine model parameters of M nodes in the parameter collection group that meets the condition, to obtain a first model parameter of the parameter collection group that meets the condition, where a smallest quantity s of combination nodes in the parameter collection group that meets the condition≤M≤a total quantity of nodes included in the parameter collection group that meets the condition; and a first sending unit, configured to send, to N nodes in a parameter delivery group corresponding to the parameter collection group that meets the condition, the first model parameter of the parameter collection group that meets the condition, where 1≤N≤a total quantity of nodes included in the parameter delivery group corresponding to the parameter collection group that meets the condition.

The intra-group combination condition may be that a quantity of nodes in the parameter collection group that complete current model parameter iteration calculation reaches a preset value, that is, the smallest quantity s of combination nodes.

It should be noted that the smallest quantity s of combination nodes, M, and N may be set in advance, s≤M≤the total quantity of nodes included in the parameter collection group that meets the condition, and 1≤N≤the total quantity of nodes included in the parameter delivery group corresponding to the parameter collection group that meets the condition.

With reference to the third aspect, in a first possible implementation manner of the third aspect, the first combination unit includes:

a receiving module, configured to receive the model parameters of the M nodes that are sent by the M nodes completing iteration in the parameter collection group that meets the condition; and a combination module, configured to combine the received model parameters of the M nodes to obtain the first model parameter of the parameter collection group that meets the condition.

The combination module may combine, in many different combination manners, the model parameters corresponding to the M nodes, to obtain the first model parameter. For example, the combination module combines, at one time, the model parameters corresponding to the M nodes, to obtain the first model parameter; or after each node completes iteration, the node sends a model parameter to the combination module, and the combination module receives and combines parameters from nodes, and performs a receiving and combination process for multiple times until combination of all the M nodes is completed, to obtain the first model parameter; or the like. This is not limited in the embodiments of the present invention.

With reference to the third aspect, in a second possible implementation manner of the third aspect, the first combination unit includes:

an obtaining module, configured to obtain node status information of the parameter collection group that meets the condition, where the node status information may include a node identifier and a sequence of a node completing iteration; and an instruction module, configured to instruct, according to the node status information of the parameter collection group that meets the condition, the M nodes completing iteration in the parameter collection group that meets the condition, to combine the model parameters to obtain the first model parameter of the parameter collection group.

The instruction module may instruct the M nodes completing iteration, to perform combination in different combination manners. For example, the instruction module may instruct the M nodes to send the corresponding model parameters to one node of the M nodes, so that the node performs combination for one time to obtain the first model parameter. Alternatively, the instruction module performs combination in the following third possible implementation manner of the third aspect to improve efficiency of obtaining the first model parameter by performing combination of the model parameters of the M nodes. Certainly, the instruction module may also perform combination in another combination manner. This is not limited in the embodiments of the present invention.

With reference to the second possible implementation manner of the third aspect, in a third possible implementation manner of the third aspect, the instruction module is specifically configured to:

determine, according to the node status information of the parameter collection group, s nodes completing iteration in the parameter collection group; and instruct one node of the s nodes completing iteration, to combine model parameters of the s nodes, where in this case, the node may be referred to as a combination node.

It should be noted that the combination node may be the last node completing iteration, or may be a node with the smallest node number. This is not limited in the embodiments of the present invention.

If a new node completes iteration in a process in which the combination node combines the model parameters corresponding to the s nodes, there may be two cases according to a value relationship between s and a quantity of new nodes.

In a first case, there are x new nodes, and when x<s, if the x new nodes complete iteration in the process in which the model parameters of the s nodes completing iteration are combined, one node of the x new nodes is instructed to combine model parameters of the x new nodes with a combined model parameter of the s nodes.

In a second case, there are y new nodes, and when y≥s, if the y new nodes complete iteration in the process in which the model parameters of the s nodes completing iteration are combined, one node of the y new nodes is instructed to combine model parameters of the y nodes, and then combine a combined model parameter of the y nodes with a combined model parameter of the s nodes.

It should be noted that after the foregoing two cases, if the M nodes have a remaining node that has not participated in combination, the instruction module may instruct the remaining node to perform model parameter combination still by using the methods provided in the foregoing two cases, so as to improve efficiency of combining the model parameters of the M nodes. Certainly, combination may also be performed in another manner. This is not limited in the embodiments of the present invention.

In addition, one node of the new nodes may be a node with the smallest node number in the new nodes, or may be the last node completing iteration. This is not limited in the embodiments of the present invention.

With reference to any one of the third aspect to the third possible implementation manner of the third aspect, in a fourth possible implementation manner of the third aspect, the apparatus further includes:

a second combination unit, configured to: when W parameter collection groups meet an inter-group combination condition, separately combine all model parameters of nodes in each parameter collection group in the W parameter collection groups to obtain a second model parameter of each parameter collection group in the W parameter collection groups.

The W parameter collection groups are determined by upper-layer parameter collection groups of the W parameter collection groups, and W≤a total quantity of groups included in the upper-layer parameter collection groups.

In addition, the inter-group combination condition may be that a quantity of intra-group combination times of the parameter collection group reaches a preset quantity of times. Correspondingly, when a quantity of intra-group combination times of the W parameter collection groups reaches the preset quantity of times, for each parameter collection group in the W parameter collection groups, the second combination unit may be configured to combine all current model parameters of all nodes in the parameter collection group to obtain a second model parameter, so as to obtain the second model parameter of each parameter collection group in the W parameter collection groups.

A third combination unit is configured to combine second model parameters of all parameter collection groups in the W parameter collection groups to obtain a third model parameter; and a second sending unit is configured to send the third model parameter to nodes in the W parameter collection groups or to nodes in upper-layer parameter delivery groups of the W parameter collection groups.

The second sending unit may perform sending in a broadcast manner, or may perform sending in an iteration manner. That is, the second sending unit separately sends the third model parameter to a node in each parameter collection group included in the W parameter collection groups, so that the node sequentially sends the third model parameter to another node in the group in an iteration manner.

Then, the third model parameter is sent to a node in a parameter delivery group corresponding to each parameter collection group in the W parameter collection groups. A sending manner may be a dedicated broadcast manner or an iteration manner.

With reference to the fourth possible implementation manner of the third aspect, in a fifth possible implementation manner of the third aspect, the third combination unit is specifically configured to:

determine, from the W parameter collection groups, one node as an inter-group combination node; and separately select one node from another parameter collection group in the W parameter collection groups except a parameter collection group in which the inter-group combination node is located, to send a second model parameter of the corresponding parameter collection group to the inter-group combination node, so that the inter-group combination node combines the second model parameters of the W parameter collection groups to obtain the third model parameter, where when the node is selected from the W parameter collection groups, a node responsible for overall combination may be selected from the parameter collection groups;

or, separately determine one node from each parameter collection group in the W parameter collection groups, and determine the determined nodes as a new parameter collection group; and when the new parameter collection group meets an intra-group combination condition, combine the second model parameters of the W parameter collection groups that meet the intra-group combination condition, to obtain the third model parameter.

It should be noted that the combining the second model parameters of the W parameter collection groups that meet the intra-group combination condition indicates combining the second model parameters of all the parameter collection groups in the W parameter collection groups.

In addition, when the node is determined from each parameter collection group in the W parameter collection groups, a node responsible for overall combination may be selected from each parameter collection group, or a node with the smallest number may be selected, or the like. This is not limited in the present invention.

Furthermore, a model parameter combination method for the new parameter collection group is similar to the intra-group combination method for the parameter collection group that meets the condition. Details are not described herein again in the present invention.

With reference to the third aspect, in a sixth possible implementation manner of the third aspect, the first sending unit is specifically configured to:

send, in a broadcast manner, the first model parameter of the parameter collection group to the nodes in the parameter delivery group corresponding to the parameter collection group that meets the condition; or send, to a first node in the parameter delivery group corresponding to the parameter collection group that meets the condition, the first model parameter of the parameter collection group that meets the condition, so that the first node sequentially sends, in an iteration manner to another node in the N nodes except the first node, the first model parameter of the parameter collection group that meets the condition.

With reference to any one of the third aspect to the sixth possible implementation manner of the third aspect, in a seventh possible implementation manner of the third aspect, the apparatus further includes:

a first grouping unit, configured to: when a preset condition is met, regroup nodes included in the parameter collection group and the parameter delivery group.

The preset condition may be that a specific time passes, or model parameter combination is completed for a specific quantity of times, or iteration is completed for a specific quantity of times, or the like. This is not limited in the embodiments of the present invention.

In addition, the step of regrouping nodes included in the parameter collection group and the parameter delivery group may be performed by a node grouping apparatus provided in a fourth aspect of the present invention. Details are not described herein in the present invention.

A fourth aspect provides a node grouping apparatus that is applied to a machine learning system, where the machine learning system includes at least two nodes, and the apparatus includes:

a second grouping unit, configured to group the nodes in the machine learning system, so that the machine learning system includes at least one parameter collection group and at least one parameter delivery group, each parameter collection group is corresponding to at least one parameter delivery group, and a node included in the at least one parameter collection group is different from a node included in a parameter delivery group corresponding to the parameter collection group.

That each parameter collection group is corresponding to at least one parameter delivery group indicates that one parameter collection group may be corresponding to one parameter delivery group or may be corresponding to multiple parameter delivery groups.

In addition, that the node included in the parameter collection group is different from the node included in the parameter delivery group corresponding to the parameter collection group indicates that nodes included in the at least one parameter collection group are not exactly the same as nodes included in the corresponding parameter delivery group, or may indicate that at least one node included in the parameter collection group is different from a node included in the parameter delivery group corresponding to the parameter collection group, or may indicate that all nodes included in the parameter collection group are different from all nodes included in the parameter delivery group corresponding to the parameter collection group.

With reference to the fourth aspect, in a first possible implementation manner of the fourth aspect, different parameter collection groups have a same quantity of or different quantities of nodes; and/or different parameter delivery groups have a same quantity of or different quantities of nodes; and/or a quantity of nodes in a parameter collection group may be the same as or different from a quantity of nodes in a parameter delivery group corresponding to the parameter collection group.

With reference to the first possible implementation manner of the fourth aspect, in a second possible implementation manner of the fourth aspect, the machine learning system further includes a parameter server, a parameter collection group and a corresponding parameter delivery group are corresponding to a same parameter server, and different parameter collection groups and corresponding parameter delivery groups are corresponding to different parameter servers.

With reference to the second possible implementation manner of the fourth aspect, in a third possible implementation manner of the fourth aspect, the parameter server includes Y layers, one parameter server of the $(j+1)^{th}$ layer is corresponding to at least one parameter server of the $j^{th}$ layer, the parameter collection group and the parameter delivery group corresponding to the parameter collection group are corresponding to a parameter server of the first layer, and $1 \leq j < j+1 \leq Y$.

With reference to any one of the fourth aspect to the third possible implementation manner of the fourth aspect, in a fourth possible implementation manner of the fourth aspect, the second grouping unit specifically includes:

a first determining module, configured to determine a correspondence between a node identifier and a node number;

a second determining module, configured to determine a quantity of parameter collection groups and a quantity of parameter delivery groups;

a third determining module, configured to determine the parameter collection group and the parameter delivery group based on the correspondence between a node identifier and a node number, the quantity of parameter collection groups, and the quantity of parameter delivery groups; and a fourth determining module, configured to determine a correspondence between the parameter collection group and the parameter delivery group.

The node identifier is used to uniquely identify a node. For example, the node identifier may be an IP address of a node or a sequence code of a node. This is not limited in the present invention. The node number may be a sequence number randomly assigned to a node, or may be any value randomly assigned to a node, or the like. This is also not limited in the present invention.

When a preset condition is met, and regrouping is performed by using the node grouping method, a node number of each node may change, the quantity of parameter collection groups and the quantity of parameter delivery groups may change, and the correspondence between the parameter collection group and the parameter delivery group may also change correspondingly.

With reference to the fourth possible implementation manner of the fourth aspect, in a fifth possible implementation manner of the fourth aspect, the third determining module is specifically configured to:

divide a node number corresponding to a node identifier by the quantity of parameter collection groups, to obtain a collection group remainder of a node;

divide the node number corresponding to the node identifier by the quantity of parameter delivery groups, to obtain a delivery group remainder of the node; and determine nodes having a same collection group remainder as a same parameter collection group, and determine nodes having a same delivery group remainder as a same parameter delivery group.

A fifth aspect provides a model parameter combination apparatus, where the model parameter combination apparatus includes a processor and a memory, the memory stores code and data, the processor can run the code in the memory, and the processor is configured to perform the model parameter combination method according to any one of the foregoing first aspect to the seventh possible implementation manner of the first aspect.

With reference to the fifth aspect, in a first possible implementation manner of the fifth aspect, the model parameter combination apparatus is a parameter server, where the parameter server is disposed independently of the node or is configured on the node.

A sixth aspect provides a controller, where the controller includes a processor and a memory, the memory stores code and data, the processor can run the code in the memory, and the processor is configured to perform the node grouping method according to any one of the second aspect to the fifth possible implementation manner of the second aspect.

A seventh aspect provides a machine learning system, where the machine learning system includes the model parameter combination apparatus according to either of the foregoing fifth aspect or the first possible implementation manner of the fifth aspect and the controller according to the sixth aspect.

According to the model parameter combination method and apparatus that are provided in the embodiments of the present invention, intra-group combination is performed on a parameter collection group to obtain a first model parameter, and the first model parameter is sent to a parameter delivery group corresponding to the parameter collection group. Therefore, a problem that model parameter combination has a high performance requirement for a parameter server, and a large data transmission volume is resolved.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and persons of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely some but not all of the embodiments of the present invention. All other embodiments obtained by persons of ordinary skill in the art based on the embodiments of the present invention without creative efforts shall fall within the protection scope of the present invention.

Embodiment 1

Figure 1:
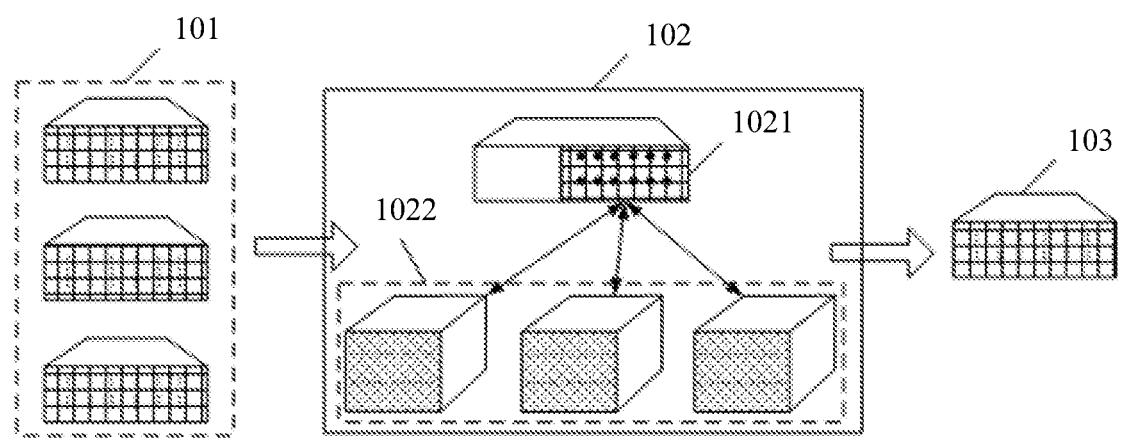
FIG. 1 is a schematic structural diagram of a machine learning system according to an embodiment of the present invention.

FIG. 1 shows an architecture of a machine learning system applied to this embodiment of the present invention. The system architectural diagram includes a data storage device 101, a model parameter training platform 102, and a model parameter storage device 103.

The data storage device 101 may be a data storage server 101. The data storage server 101 may be configured to store original data for model parameter training. A storage capacity of the data storage server 101 is far greater than a storage capacity of a calculation server 1021 in the model parameter training platform 102. The original data may be language data, image data, video data, or the like. The original data includes multiple data sets, and each data set further includes multiple type subsets. Each type subset carries a data label used to indicate a type. Type subsets included in a same data set have a same label. For example, the data set may include multiple person images carrying a person label; or may include multiple animal images carrying an animal label, or another type of images.

The model parameter training platform 102 includes: the calculation server 1021 for iteration calculation, which may also be referred to as a node and may be specifically a common computer, a mobile terminal, a workstation, a general server unit, a private server, or the like; and a switch 1022 responsible for data communication between calculation servers. The calculation server 1021 has local storage, and the capacity of the calculation server 1021 is less than that of the data storage server 101. During model parameter training, each calculation server reads, in a sampling manner, specific data from the data storage server 101, and stores the specific data into a local storage device for a purpose of model parameter training. The model parameter training platform 102 may perform model parameter training and combination on data sets carrying data labels, to obtain a total model parameter finally output after the combination, and may identify a data type of new data according to the total model parameter. For example, when model parameter combination is performed on an image data set carrying a person label, a person image in new image data may be identified according to a final output model parameter; when model parameter combination is performed on an image data set carrying an animal label, an animal image in new image data may be identified according to a final output model parameter.

The model parameter storage device 103 is configured to store a model parameter obtained by means of training. After completing training and combination, the model parameter training platform 102 may send, to the model parameter storage server 103, a model parameter finally obtained after the combination, so that the model parameter storage server 103 stores the model parameter for subsequent use. In addition, an initial model parameter that is used to perform model parameter training and combination by the calculation server 1021 in the model parameter training platform 102 may be obtained from the model parameter storage server 103.

Embodiment 2

Figure 2:
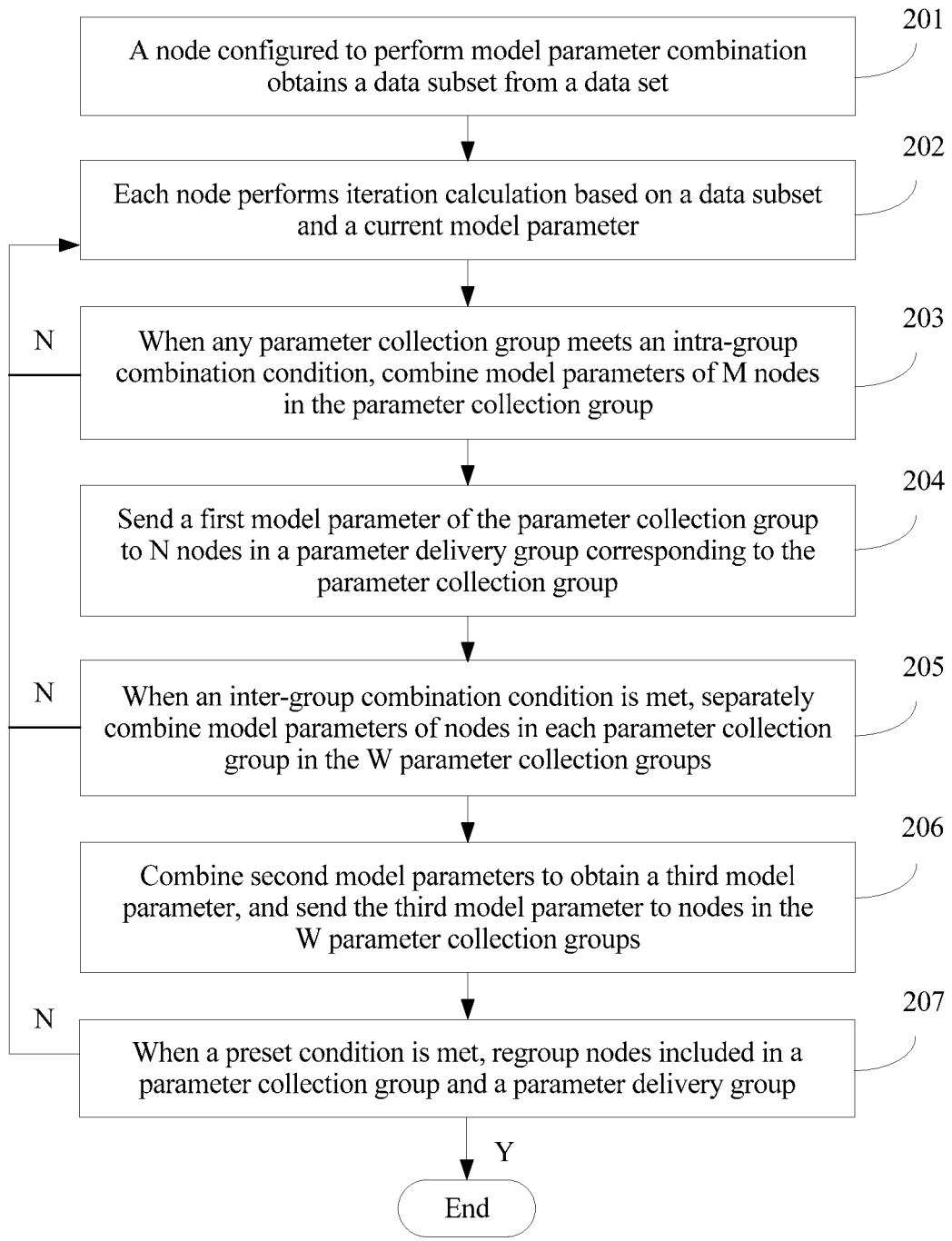
FIG. 2 is a schematic flowchart of a model parameter combination method according to an embodiment of the present invention.

FIG. 2 shows a model parameter combination method according to an embodiment of the present invention. The method is applied to a machine learning system. The machine learning system includes at least one parameter collection group and at least one parameter delivery group. Each parameter collection group is corresponding to at least one parameter delivery group. Each parameter collection group includes at least one node. Each parameter delivery group includes at least one node. A node included in the at least one parameter collection group is different from a node included in a corresponding parameter delivery group. The method includes the following several steps.

Step 201: A node configured to perform model parameter combination obtains a data subset from a data set.

The data set refers to a data set used for model parameter iteration calculation. The data set may be language data, image data, video data, or the like. The data set includes multiple type subsets. Each type subset carries a data label used to indicate a type. Type subsets included in a same data set have a same label.

In addition, the data set may be pre-stored in a storage device such as a hard disk or a magnetic disk, or may be pre-stored in a data storage server. When obtaining the data subset from the data set, the node may directly connect the storage device to a device in which the node is located, to obtain the data subset; or obtain the data from the data storage server.

It should be noted that because the data set used for model parameter combination is far greater than a data volume used for an actual model parameter, the node may extract a specific volume of data from the data set when the node obtains the data subset from the data set. If a calculation capability of each node is learned in advance, a data volume of a data subset obtained by the node may be allocated according to the calculation capability of the node.

In addition, that the node included in the at least one parameter collection group is different from the node included in the corresponding parameter delivery group indicates that nodes included in the at least one parameter collection group are not exactly the same as nodes included in the corresponding parameter delivery group, that is, at least one node included in the at least one parameter collection group is different from a node included in the parameter delivery group corresponding to the parameter collection group; or may indicate that all nodes included in the parameter collection group are different from all nodes included in the parameter delivery group corresponding to the parameter collection group.

Step 202: Each node performs iteration calculation based on a data subset and a current model parameter.

When performing model parameter iteration calculation for the first time, each node may perform iteration calculation based on an obtained data subset and an initial model parameter. When completing the iteration calculation, each node may perform iteration calculation for a next time based on the data subset and the currently obtained model parameter.

The initial model parameter refers to the very first model parameter of each node. All nodes may have a same initial model parameter. The currently obtained model parameter refers to a model parameter obtained after each node completes current iteration calculation, or a currently received model parameter, that is, a current latest model parameter.

Step 203: When any parameter collection group meets an intra-group combination condition, combine model parameters of M nodes in the parameter collection group that meets the condition, to obtain a first model parameter of the parameter collection group that meets the condition, where a smallest quantity s of combination nodes in the parameter collection group that meets the condition≤M≤a total quantity of nodes included in the parameter collection group that meets the condition.

The intra-group combination condition indicates that a quantity of nodes in the parameter collection group that complete current model parameter iteration calculation reaches a preset value, that is, the smallest quantity s of combination nodes.

Because the machine learning system includes at least one parameter collection group, and each parameter collection group may include one or more nodes, when nodes in any parameter collection group meet a condition that a quantity of nodes in current model parameter iteration calculation reaches the preset value, M nodes that complete the current model parameter iteration calculation may be selected from the parameter collection group, and model parameters obtained after the calculation performed by the M nodes are combined to obtain a first model parameter.

It should be noted that M and the smallest quantity s of combination nodes may be set in advance, and s≤M≤the total quantity of nodes included in the parameter collection group.

In addition, a quantity of parameter collection groups included in the machine learning system, a quantity of nodes included in each parameter collection group, a quantity of parameter delivery groups corresponding to each parameter collection group, and a quantity of nodes included in each parameter delivery group may be determined in advance, or may be determined after each node obtains a data subset, that is, determined after step 201. This is not limited in this embodiment of the present invention.

Further, combining the model parameters of the M nodes in the parameter collection group to obtain the first combined model parameter of the parameter collection group may be performed by using the following two different methods according to different executors.

In a first method, the model parameters of the M nodes that are sent by the M nodes completing iteration in the parameter collection group that meets the condition are received; and the received model parameters of the M nodes are combined to obtain the first model parameter of the parameter collection group that meets the condition.

The method may be completed by a device independent of the parameter collection group, for example, a parameter server. A fixed node may serve as the parameter server. Specifically, the M nodes completing iteration in the parameter collection group separately send, to the parameter server, the model parameters obtained after the current iteration calculation. When the parameter server receives the model parameters sent by the M nodes, the parameter server may combine, in many different combination manners, the model parameters corresponding to the M nodes, to obtain the first model parameter.

For example, the many different combination manners may be as follows: The parameter server combines, at one time, the model parameters corresponding to the M nodes, to obtain the first model parameter; or after each node completes iteration, the node sends a parameter to the parameter server, and the parameter server receives and combines model parameters from nodes, and performs a receiving and combination process for multiple times until combination of all the M nodes is completed, to obtain the first model parameter; or the like. This is not limited in this embodiment of the present invention.

In a second method, node status information of the parameter collection group that meets the condition is obtained, where the node status information may include a node identifier and a sequence of a node completing iteration; and the M nodes completing iteration in the parameter collection group that meets the condition are instructed according to the node status information of the parameter collection group that meets the condition, to combine the model parameters to obtain the first model parameter of the parameter collection group.

The method may be completed by a node in the parameter collection group. The node may be referred to as a control node. The control node may be specified in advance, or may be temporarily determined by means of recommendation by nodes in the parameter collection group. The control node may collect statistics on the node status information of the parameter collection group, and instruct other nodes to transmit and combine model parameters.

When the control node instructs, according to the node status information of the parameter collection group, the M nodes completing iteration, to perform combination, the control node may instruct the M nodes completing iteration, to perform combination in different combination manners. For example, the control node may instruct the M nodes to send the corresponding model parameters to one node of the M nodes, so that the node performs combination for one time to obtain the first model parameter. Alternatively, the control node performs combination in the following implementation manner to improve efficiency of obtaining the first model parameter by performing the model parameters of the M nodes. Certainly, the control node may also perform combination in another combination manner. This is not limited in this embodiment of the present invention.

Optionally, when the control node instructs, according to the node status information of the parameter collection group, the M nodes completing iteration, to perform combination, the control node may determine, according to the node status information of the parameter collection group, s nodes completing iteration in the parameter collection group, and then instruct one node of the s nodes completing iteration, to combine model parameters of the s nodes.

Specifically, after determining the s nodes completing iteration in the parameter collection group, the control node instructs to use one node of the s nodes as a combination node, and another node separately sends, to the combination node, a model parameter obtained after current iteration, so that the combination node combines the model parameters corresponding to the s nodes.

It should be noted that the combination node may be the last node completing iteration, or may be a node with the smallest node number. This is not limited in this embodiment of the present invention.

If a new node completes iteration in a process in which the combination node combines the model parameters corresponding to the s nodes, there may be two cases according to a value relationship between s and a quantity of new nodes.

In a first case, there are x new nodes, and when x<s, if the x new nodes complete iteration in the process in which the model parameters of the s nodes completing iteration are combined, one node of the x new nodes is instructed to combine model parameters of the x new nodes with a combined model parameter of the s nodes.

In a second case, there are y new nodes, and when y≥s, if the y new nodes complete iteration in the process in which the model parameters of the s nodes completing iteration are combined, one node of the y new nodes is instructed to combine model parameters of the y nodes, and then combine a combined model parameter of the y nodes with a combined model parameter of the s nodes.

It should be noted that after the foregoing two cases, if the M nodes have a remaining node that has not participated in combination, the remaining node may perform model parameter combination still by using the methods provided in the foregoing two cases, so as to improve efficiency of combining the model parameters of the M nodes. Certainly, combination may also be performed in another manner. This is not limited in this embodiment of the present invention.

In addition, one node of the new nodes may be a node with the smallest node number in the new nodes, or may be the last node completing iteration. This is not limited in this embodiment of the present invention.

Further, when the intra-group combination condition is met and the model parameters of the M nodes are combined, if an intra-group delivery condition is not met, the parameter collection group performs a new round of iteration calculation based on the first model parameter obtained by means of combination, that is, goes back to step 202 and performs step 202, and updates the first model parameter each time the model parameters of the M nodes are combined is completed. If the parameter collection group meets the intra-group delivery condition, step 204 is performed.

The intra-group delivery condition may be that a quantity of intra-group combination times reaches a preset quantity of times, or preset duration passes, or the like. This is not limited in this embodiment of the present invention.

Step 204: Send, to N nodes in a parameter delivery group corresponding to the parameter collection group that meets the condition, the first model parameter of the parameter collection group that meets the condition, where 1≤N≤a total quantity of nodes included in the parameter delivery group corresponding to the parameter collection group that meets the condition.

A parameter collection group is corresponding to a parameter delivery group, that is, one parameter collection group may be corresponding to one or more parameter delivery groups. Therefore, when the intra-group delivery condition is met, the first model parameter may be sent to nodes in the corresponding parameter delivery group based on a correspondence between the parameter collection group and the parameter delivery group. The nodes may be all nodes or may be some nodes in the parameter delivery group.

When the first model parameter is sent to the nodes in the corresponding parameter delivery group, the first model parameter of the parameter collection group that meets the condition may be sent in a broadcast manner to the nodes in the parameter delivery group corresponding to the parameter collection group that meets the condition. Alternatively, the first model parameter of the parameter collection group that meets the condition may be sent in an iteration manner to the nodes in the parameter delivery group corresponding to the parameter collection group that meets the condition. That is, the first model parameter of the parameter collection group that meets the condition is sent to a first node in the parameter delivery group corresponding to the parameter collection group that meets the condition, so that the first node sequentially sends, in an iteration manner to another node in the N nodes except the first node, the first model parameter of the parameter collection group that meets the condition. For example, the first node sends the first model parameter to a second node, and then the second node sends the first model parameter to a third node. The first model parameter is sent in an iteration manner until the first model parameter is sent to all other nodes in the N nodes except the first node.

It should be noted that the first node may be any node of the last node completing iteration in the parameter collection group, or may be a node recommended by all nodes in the parameter delivery group. This is not limited in this embodiment of the present invention.

In addition, step 204 may be completed in the foregoing manner by a device independent of the parameter collection group, for example, the parameter server, or may be completed in the foregoing manner by one node in the parameter collection group, for example, the control node. This is not limited in this embodiment of the present invention.

When the machine learning system includes a parameter server, a parameter collection group and a parameter delivery group corresponding to the parameter collection group are corresponding to a same parameter server, and different parameter collection groups and corresponding parameter delivery groups are corresponding to different parameter servers.

Further, the parameter server includes Y layers. One parameter server of the $(j+1)^{th}$ layer is corresponding to at least one parameter server of the $j^{th}$ layer. The parameter collection group and the parameter delivery group corresponding to the parameter collection group are corresponding to a parameter server of the first layer, and $1 \leq j < j+1 \leq Y$.

Step 205: When W parameter collection groups meet an inter-group combination condition, separately combine all model parameters of nodes in each parameter collection group in the W parameter collection groups to obtain a second model parameter of each parameter collection group in the W parameter collection groups.

The W parameter collection groups are determined by upper-layer parameter collection groups of the W parameter collection groups, and W≤a total quantity of groups included in the upper-layer parameter collection groups.

In addition, the inter-group combination condition may be that a quantity of intra-group combination times of the parameter collection group reaches a preset quantity of times, or a specific time passes, or the like. This is not limited in this embodiment of the present invention.

Correspondingly, if the inter-group combination condition is that the quantity of intra-group combination times of the parameter collection group reaches the preset quantity of times, when a quantity of intra-group combination times of the W parameter collection groups reaches the preset quantity of times, for each parameter collection group in the W parameter collection groups, the parameter collection group may combine all current model parameters of all nodes in the group to obtain a second model parameter, so as to obtain the second model parameter of each parameter collection group in the W parameter collection groups.

The foregoing step 203 may be completed by a device independent of the parameter collection group, or may be completed by a node in the parameter collection group. Correspondingly, when step 203 is performed by different executors, step 205 may also be performed differently, and details are as follows:

When an executor is a device independent of the parameter collection group, for example, the parameter server, the parameter server determines whether the W parameter collection groups meet the inter-group combination condition, and combines all the model parameters of the nodes in each parameter collection group in the W parameter collection groups when the inter-group combination condition is met.

When an executor is a node in the parameter collection group, for example, the control node, the control node determines whether the W parameter collection groups meet the inter-group combination condition, and when the inter-group combination condition is met, the node in the parameter collection group receives model parameters sent by other nodes, and combines all the received model parameters of the other nodes. In this case, the node may be referred to as a combination node.

For example, when the control node determines that the W parameter collection groups meet the inter-group combination condition, all nodes in each parameter collection group may send current model parameters to one node in the group, so that the node combines all the current model parameters of all the nodes to obtain a second model parameter. Certainly, combination may also be performed in another manner. This is not limited in this embodiment of the present invention.

Further, when the W parameter collection groups do not meet the inter-group combination condition, go back to step 202 and continue to perform step 202; otherwise, perform step 206.

Step 206: Combine second model parameters of all parameter collection groups in the W parameter collection groups to obtain a third model parameter; and send the third model parameter to nodes in the W parameter collection groups or to nodes in upper-layer parameter delivery groups of the W parameter collection groups.

Combining the second model parameters of the W parameter collection groups to obtain the third model parameter may be specifically described according to different executors of step 203.

When an executor is a device independent of the parameter collection group, for example, the parameter server, the parameter server directly combines the second model parameters of the W parameter collection groups to obtain the third model parameter.

Correspondingly, when the third model parameter is sent to the nodes in the W parameter collection groups or to the nodes in the upper-layer parameter delivery groups of the W parameter collection groups, the parameter server may directly send, in a broadcast manner, the third model parameter to the nodes participating in combination in the W parameter collection groups, or the last node for combination sends the third model parameter to the nodes in the upper-layer parameter delivery groups of the W parameter collection groups.

Further, the parameter server may further include multiple layers, and one upper-layer parameter server is corresponding to at least one lower-layer parameter server. The parameter collection group and the parameter delivery group corresponding to the parameter collection group are corresponding to a bottom-layer parameter server. A lower-layer server sends a quantity of combination times, a node identifier, and a current model parameter of each parameter collection group to an upper-layer parameter server. The upper-layer parameter server determines whether the inter-group combination condition is met. After the inter-group combination condition is met, the upper-layer parameter server performs combination, and then sends, to the lower-layer parameter server, a model parameter obtained after the combination. Finally, the bottom-layer parameter server sends the model parameter to the nodes in the W parameter collection groups.

When an executor is a node in the parameter collection group, for example, the control node, nodes participating in combination in the W parameter collection groups determine one node in the W parameter collection groups as an inter-group combination node. One node is separately selected from another parameter collection group in the W parameter collection groups except a parameter collection group in which the inter-group combination node is located, to send a second model parameter of the corresponding parameter collection group to the inter-group combination node, so that the inter-group combination node combines the second model parameters of the W parameter collection groups to obtain the third model parameter.

It should be noted that the inter-group combination node may be a node recommended by all nodes in the W parameter collection groups, or the first node completing iteration, or a node with the smallest node number. This is not limited in this embodiment of the present invention.

In addition, when the node is separately selected from the another parameter collection group in the W parameter collection groups except the parameter collection group in which the inter-group combination node is located, a node responsible for overall combination may be selected from the parameter collection group.

In another embodiment, one node is separately determined from each parameter collection group in the W parameter collection groups, and the determined nodes are determined as a new parameter collection group; and when the new parameter collection group meets an intra-group combination condition, the second model parameters of the W parameter collection groups that meet the intra-group combination condition are combined to obtain the third model parameter.

It should be noted that the combining the second model parameters of the W parameter collection groups that meet the intra-group combination condition indicates combining the second model parameters of all the parameter collection groups in the W parameter collection groups.

In addition, when the node is determined from each parameter collection group in the W parameter collection groups, a node responsible for overall combination may be selected from each parameter collection group, or a node with the smallest number may be selected, or the like. This is not limited in the present invention.

Furthermore, a model parameter combination method for the new parameter collection group is similar to the foregoing intra-group combination method for the parameter collection group that meets the condition. Details are not described herein again in the present invention.

For example, a node responsible for overall intra-group combination may be separately selected from each parameter collection group in the W parameter collection groups to obtain W nodes. The W nodes are determined as the new parameter collection group. When the nodes in the new parameter collection group meet the intra-group combination condition, W second model parameters corresponding to the W nodes are combined in an intra-group combination manner. For example, when the intra-group combination condition is that a quantity of nodes completing overall combination reaches a preset quantity, if a quantity of nodes completing overall combination in the new parameter collection group reaches the preset quantity, combination of the nodes completing overall combination may be performed, and then a combined model parameter is combined with a model parameter of another node completing intra-group combination. Certainly, the W second model parameters corresponding to the W nodes may also be combined at one time. This is not limited in this embodiment of the present invention.

Correspondingly, when sending the third model parameter to the nodes in the W parameter collection groups, the inter-group combination node may send the third model parameter in a broadcast manner, or may send the third model parameter in an iteration manner. That is, the inter-group combination node separately sends the third model parameter to a node in a parameter collection group included in the W parameter collection groups, so that the node sequentially sends, in an iteration manner, the third model parameter to another node participating in inter-group combination.

After sending the third model parameter to the nodes in the W parameter collection groups, the parameter server or each parameter collection group may send the third model parameter to a node in a parameter delivery group corresponding to each parameter collection group in the W parameter collection groups. A sending manner may be a broadcast manner or an iteration manner.

Correspondingly, the third model parameter may be sent to the nodes in the upper-layer parameter delivery groups of the W parameter collection groups in a broadcast manner or in an iteration manner. That is, the last node completing combination separately sends the third model parameter to first nodes in the upper-layer parameter delivery groups, and the nodes sequentially send the third model parameter to another node in the upper-layer parameter delivery groups in an iteration manner. The first nodes refer to nodes responsible for receiving an upper-layer model parameter.

Then, the third model parameter is sent to a node in each lower-layer parameter delivery group in the upper-layer parameter delivery groups. A sending manner may be a broadcast manner or an iteration manner.

Step 207: When a preset condition is met, regroup nodes included in a parameter collection group and a parameter delivery group.

The preset condition may be that a specific time passes, or model parameter combination is completed for a specific quantity of times, or iteration calculation is completed for a specific quantity of times, or the like. This is not limited in this embodiment of the present invention.

In addition, when an executor is a device independent of the parameter collection group, for example, the parameter server, when the preset condition is met, the parameter server directly regroups the nodes included in the parameter collection group and the parameter delivery group. When an executor is a node in the parameter collection group, for example, the control node, the control node regroups the nodes included in the parameter collection group and the parameter delivery group.

Optionally, the regrouping nodes included in a parameter collection group and a parameter delivery group includes: dividing, based on a preset correspondence between a node identifier and a node number, a quantity of parameter collection groups, and a quantity of parameter delivery groups, a node number corresponding to a node identifier by the quantity of parameter collection groups, to obtain a collection group remainder of a node;

dividing the node number corresponding to the node identifier by the quantity of parameter delivery groups, to obtain a delivery group remainder of the node; and determining nodes having a same collection group remainder as a same parameter collection group, and determining nodes having a same delivery group remainder as a same parameter delivery group.

Specifically, for the method for regrouping the nodes included in the parameter collection group and the parameter delivery group, a node grouping method provided in the following embodiment may be performed for regrouping. Details are not described herein in this embodiment of the present invention.

After the regrouping, go back to step 202, and continue to perform iteration calculation based on a data subset and a current model parameter until a final model parameter is output.

Further, in a process of performing steps 202 to 207, when there is a new node, if an executor is a parameter server, the parameter server assigns an IP address of the bottom-layer parameter server to the new node. The bottom-layer parameter server sends a model parameter to the new node. The new node obtains a data subset from a storage server, and the new node performs iteration calculation based on the received model parameter and the data subset.

If an executor is a control node, the control node assigns an IP address of another node previously participating in iteration calculation to the new node. The another node sends a model parameter to the new node. The new node obtains a data subset from a storage server, and the new node performs iteration calculation based on the received model parameter and the data subset.

According to the model parameter combination method provided in this embodiment of the present invention, intra-group combination is performed in a parameter collection group to obtain a first model parameter, and the first model parameter is sent to a parameter delivery group corresponding to the parameter collection group; then, all first model parameters of each parameter collection group in W parameter collection groups are combined to obtain a second model parameter; inter-group combination is performed in the W parameter collection groups to obtain a third model parameter; and nodes are regrouped when a preset condition is met. Therefore, a problem that model parameter combination has a high performance requirement for a parameter server, a large data transmission volume, and a dynamic calculation resource adjustment is resolved.

Embodiment 3

This embodiment of the present invention provides a node grouping method that is applied to a machine learning system. The machine learning system includes at least two nodes. The method includes:

grouping the nodes in the machine learning system, so that the machine learning system includes at least one parameter collection group and at least one parameter delivery group, each parameter collection group is corresponding to at least one parameter delivery group, and a node included in the at least one parameter collection group is different from a node included in a parameter delivery group corresponding to the parameter collection group.

That each parameter collection group is corresponding to at least one parameter delivery group indicates that one parameter collection group may be corresponding to one parameter delivery group or may be corresponding to multiple parameter delivery groups.

In addition, that a node included in the at least one parameter collection group is different from a node included in a parameter delivery group corresponding to the parameter collection group indicates that nodes included in the at least one parameter collection group are not exactly the same as nodes included in the corresponding parameter delivery group, or may indicate that at least one node included in the parameter collection group is different from a node included in the parameter delivery group corresponding to the parameter collection group, or may indicate that all nodes included in the parameter collection group are different from all nodes included in the parameter delivery group corresponding to the parameter collection group.

Optionally, different parameter collection groups have a same quantity of or different quantities of nodes; and/or different parameter delivery groups have a same quantity of or different quantities of nodes; and/or a quantity of nodes in a parameter collection group may be the same as or different from a quantity of nodes in a parameter delivery group corresponding to the parameter collection group.

Optionally, the machine learning system may further include a parameter server. A parameter collection group and a parameter delivery group corresponding to the parameter collection group are corresponding to a same parameter server, and different parameter collection groups and parameter delivery groups corresponding to the parameter collection groups are corresponding to different parameter servers.

Optionally, the parameter server includes Y layers. One parameter server of the $(j+1)^{th}$ layer is corresponding to at least one parameter server of the $j^{th}$ layer. The parameter collection group and the parameter delivery group corresponding to the parameter collection group are corresponding to a parameter server of the first layer, and $1 \leq j < j+1 \leq Y$.

Figure 3:
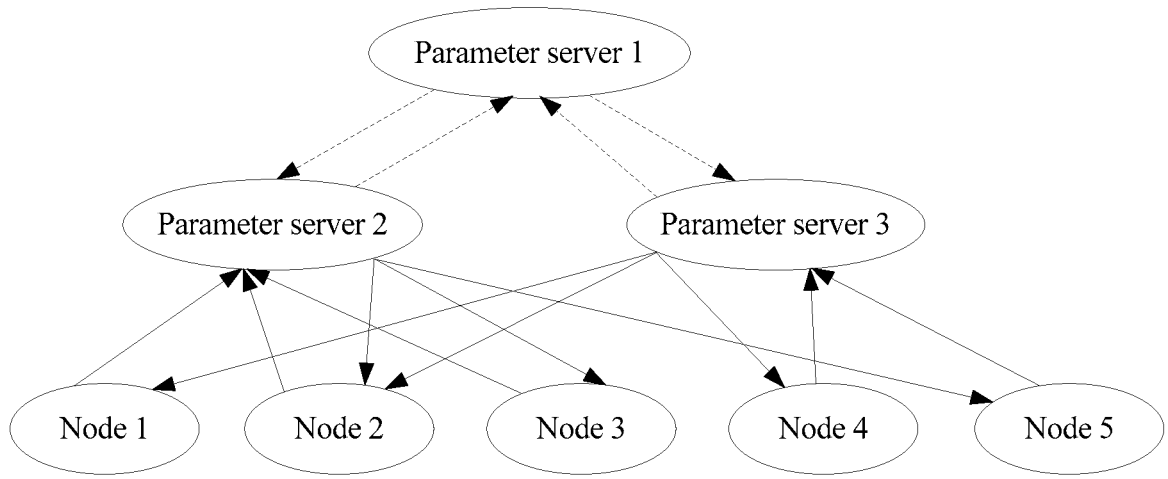
FIG. 3 is a schematic structural diagram of a parameter server according to an embodiment of the present invention.

For example, FIG. 3 is a schematic structural diagram of a parameter server when Y is equal to 2. As shown in FIG. 3, a parameter server 1 is corresponding to a parameter server 2 and a parameter server 3, and a parameter delivery group corresponding to a parameter collection group and the parameter collection group that includes a node 1, a node 2, a node 3, a node 4, and a node 5 are corresponding to parameter servers 2 and 3 of the first layer.

Figure 4:
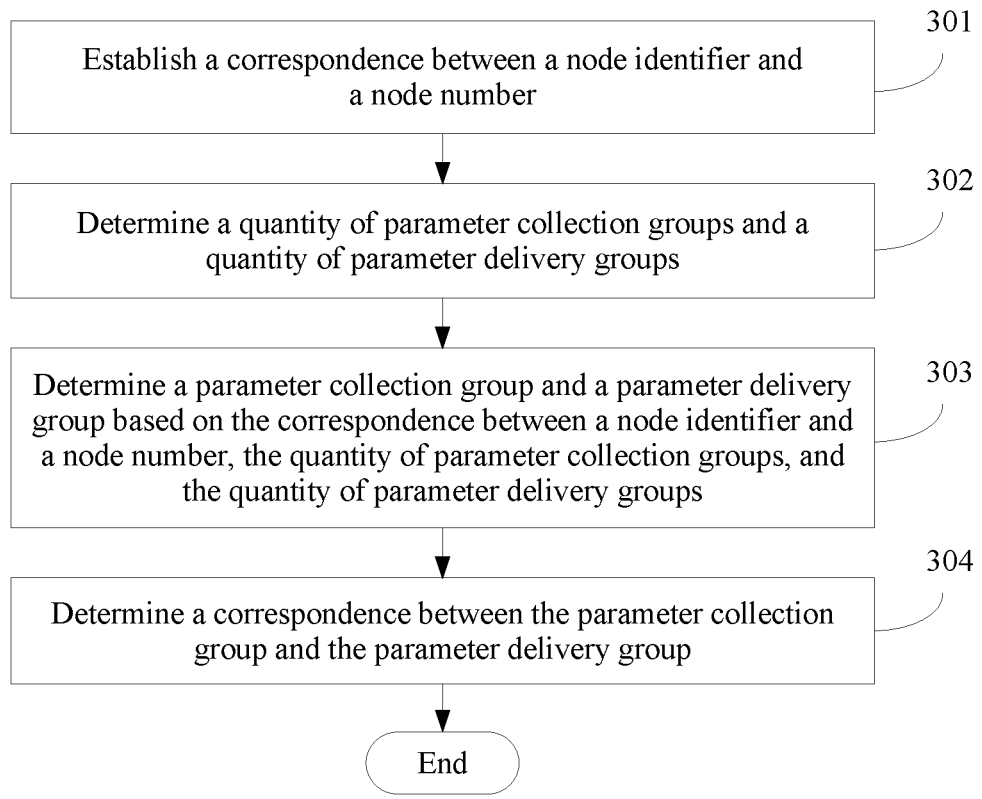
FIG. 4 is a schematic flowchart of a node grouping method according to an embodiment of the present invention.

Optionally, as shown in FIG. 4, the grouping the nodes in the machine learning system specifically includes the following steps.

Step 301: Establish a correspondence between a node identifier and a node number.

The node identifier is used to uniquely identify a node. For example, the node identifier may be an IP address of a node or a sequence code of a node. This is not limited in the present invention. The node number may be a sequence number randomly assigned to a node, or may be any value randomly assigned to a node, or the like. This is also not limited in the present invention.

For example, six nodes participate in calculation of model parameter combination. A node identifier is an IP address of a node. An IP address of each node is shown in the following Table 1. As shown in the following Table 1, a correspondence between a node identifier and a node number is established.

| Node identifier | Node number |
| --- | --- |
| 192.168.1.1 | 2 |
| 192.168.1.2 | 0 |
| 192.168.1.3 | 3 |
| 192.168.1.4 | 1 |
| 192.168.1.4 | 5 |
| 192.168.1.4 | 4 |

Step 302: Determine a quantity of parameter collection groups and a quantity of parameter delivery groups.

For example, the quantity of parameter collection groups is 2, and the quantity of parameter delivery groups is 3.

Step 303: Determine a parameter collection group and a parameter delivery group based on the correspondence between a node identifier and a node number, the quantity of parameter collection groups, and the quantity of parameter delivery groups.

Specifically, the determining a parameter collection group and a parameter delivery group based on the correspondence between a node identifier and a node number, the quantity of parameter collection groups, and the quantity of parameter delivery groups may include: dividing a node number corresponding to a node identifier by the quantity of parameter collection groups, to obtain a collection group remainder of a node; dividing the node number corresponding to the node identifier by the quantity of parameter delivery groups, to obtain a delivery group remainder of the node; and determining nodes having a same collection group remainder as a same parameter collection group, and determining nodes having a same delivery group remainder as a same parameter delivery group.

For example, each node number shown in the foregoing Table 1 is divided by the quantity of parameter collection groups, that is, 2, to obtain a collection group remainder of the node. That is, collection group remainders corresponding to node numbers 2, 0, and 4 are 0, and collection group remainders corresponding to node numbers 3, 1, and 5 are 1. Each node number shown in the foregoing Table 1 is divided by the quantity of parameter delivery groups, that is, 3, to obtain a delivery group remainder of the node. That is, delivery group remainders corresponding to node numbers 0 and 3 are 0, delivery group remainders corresponding to node numbers 1 and 4 are 1, and delivery group remainders corresponding to node numbers 2 and 5 are 2. Nodes whose collection group remainder is 0 are determined as a parameter collection group 0, and nodes whose collection group remainder is 1 are determined as a parameter collection group 1. Likewise, a parameter delivery group 0, a parameter delivery group 1, and a parameter delivery group 2 are obtained.

Step 304: Determine a correspondence between the parameter collection group and the parameter delivery group.

After the parameter collection group and parameter delivery group are determined, the correspondence between the two groups may be determined based on the determined parameter collection group and parameter delivery group. For example, it is determined that the parameter collection group 0 is corresponding to the parameter delivery group 1 and the parameter delivery group 2, and the parameter collection group 1 is corresponding to the parameter delivery group 0.

It should be noted that in the node grouping method provided in this embodiment of the present invention, each time node grouping is performed, a node number of each node may change, the quantity of parameter collection groups and the quantity of parameter delivery groups may change, and the correspondence between the parameter collection group and the parameter delivery group may also change correspondingly.

According to the node grouping method provided in this embodiment of the present invention, nodes in a machine learning system are grouped, so that the machine learning system includes at least one parameter collection group and at least one parameter delivery group, each parameter collection group is corresponding to at least one parameter delivery group, and a node included in the at least one parameter collection group is different from a node included in a parameter delivery group corresponding to the parameter collection group. Therefore, a problem that model parameter combination has a high performance requirement for a parameter server, and a dynamic calculation resource adjustment is resolved.

Embodiment 4

Figure 5:
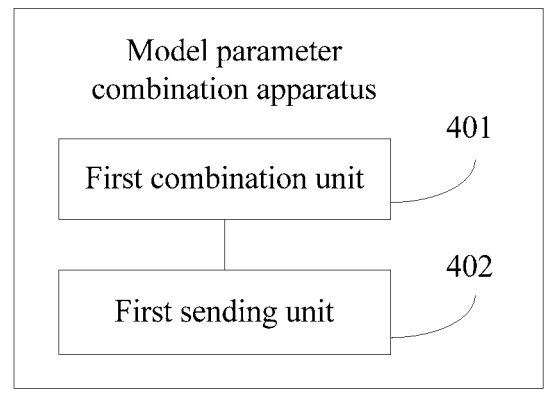
FIG. 5 is a schematic structural diagram of a model parameter combination apparatus according to an embodiment of the present invention.

FIG. 5 shows a model parameter combination apparatus according to an embodiment of the present invention. The apparatus is applied to a machine learning system. The machine learning system includes at least one parameter collection group and at least one parameter delivery group. Each parameter collection group is corresponding to at least one parameter delivery group. Each parameter collection group includes at least one node. Each parameter delivery group includes at least one node. A node included in the at least one parameter collection group is different from a node included in a corresponding parameter delivery group. The apparatus includes:

a first combination unit 401, configured to: when any parameter collection group meets an intra-group combination condition, combine model parameters of M nodes in the parameter collection group that meets the condition, to obtain a first model parameter of the parameter collection group that meets the condition, where a smallest quantity s of combination nodes in the parameter collection group that meets the condition≤M≤a total quantity of nodes included in the parameter collection group that meets the condition; and a first sending unit 402, configured to send, to N nodes in a parameter delivery group corresponding to the parameter collection group that meets the condition, the first model parameter of the parameter collection group that meets the condition, where 1≤N≤a total quantity of nodes included in the parameter delivery group corresponding to the parameter collection group that meets the condition.

The intra-group combination condition may be that a quantity of nodes in the parameter collection group that complete current model parameter iteration calculation reaches a preset value, that is, the smallest quantity s of combination nodes.

Specifically, when a quantity of nodes in any parameter collection group that complete current model parameter iteration calculation reaches the smallest quantity s of combination nodes, the first combination unit selects, from the parameter collection group, M nodes that complete the current model parameter calculation, and combines model parameters obtained by means of calculation by the M nodes, to obtain a first model parameter. Then, when an intra-group delivery condition is met, the first sending unit sends the first model parameter to all nodes or some nodes in a corresponding parameter delivery group based on a correspondence between the parameter collection group and the parameter delivery group.

It should be noted that the smallest quantity s of combination nodes, M, and N may be set in advance, s≤M≤the total quantity of nodes included in the parameter collection group, and 1≤N≤the total quantity of nodes included in the parameter delivery group corresponding to the parameter collection group.

In addition, a quantity of parameter collection groups included in the machine learning system, a quantity of nodes included in each parameter collection group, a quantity of parameter delivery groups corresponding to each parameter collection group, and a quantity of nodes included in each parameter delivery group may be determined in advance.

Furthermore, that a node included in the at least one parameter collection group is different from a node included in a corresponding parameter delivery group indicates that nodes included in the at least one parameter collection group are not exactly the same as nodes included in the corresponding parameter delivery group, or may be that at least one node included in the parameter collection group is different from a node included in the parameter delivery group corresponding to the parameter collection group, or may be that all nodes included in the parameter collection group are different from all nodes included in the parameter delivery group corresponding to the parameter collection group.

Further, when the first model parameter is sent to the parameter delivery group corresponding to the parameter collection group, address information of a node participating in combination of the first model parameter may also be sent to a node in the parameter delivery group. The address information may be an IP address of a node, a node number, or the like. This is not limited in the present invention.

Optionally, the first combination unit 401 includes:

a receiving module, configured to receive the model parameters of the M nodes that are sent by the M nodes completing iteration in the parameter collection group that meets the condition; and a combination module, configured to combine the received model parameters of the M nodes to obtain the first model parameter of the parameter collection group to which the M nodes belong.

The combination module may combine, in many different combination manners, the model parameters corresponding to the M nodes, to obtain the first model parameter. For example, the combination module combines, at one time, the model parameters corresponding to the M nodes, to obtain the first model parameter; or after each node completes iteration, the node sends a model parameter to the combination module, and the combination module receives and combines parameters from nodes, and performs a receiving and combination process for multiple times until combination of all the M nodes is completed, to obtain the first model parameter; or the like. This is not limited in this embodiment of the present invention.

Optionally, the first combination unit 401 includes:

an obtaining module, configured to obtain node status information of the parameter collection group that meets the condition, where the node status information may include a node identifier and a sequence of a node completing iteration; and an instruction module, configured to instruct, according to the node status information of the parameter collection group that meets the condition, the M nodes completing iteration in the parameter collection group that meets the condition, to combine the model parameters to obtain the first model parameter of the parameter collection group that meets the condition.

The instruction module may instruct the M nodes completing iteration, to perform combination in different combination manners. For example, the instruction module may instruct the M nodes to send the corresponding model parameters to one node of the M nodes, so that the node performs combination for one time to obtain the first model parameter. Alternatively, the instruction module instructs to perform combination in the following optional specific manner, to improve efficiency of obtaining the first model parameter by performing combination of the model parameters of the M nodes. Certainly, the instruction module may also instruct to perform combination in another combination manner. This is not limited in this embodiment of the present invention.

Optionally, the instruction module is specifically configured to:

determine, according to the node status information of the parameter collection group that meets the condition, s nodes completing iteration in the parameter collection group that meets the condition; and instruct one node of the s nodes completing iteration, to combine model parameters of the s nodes, where in this case, the node may be referred to as a combination node.

That is, after determining the s nodes completing iteration in the parameter collection group, the instruction module uses one node of the s nodes as a combination node, and another node separately sends, to the combination node, a model parameter obtained after current iteration, so that the combination node combines the model parameters corresponding to the s nodes.

It should be noted that the combination node may be the last node completing iteration, or may be a node with the smallest node number. This is not limited in this embodiment of the present invention.

If a new node completes iteration in a process in which the combination node combines the model parameters corresponding to the s nodes, there may be two cases according to a value relationship between s and a quantity of new nodes.

In a first case, there are x new nodes, and when x<s, if the x new nodes complete iteration in the process in which the model parameters of the s nodes completing iteration are combined, one node of the x new nodes is instructed to combine model parameters of the x new nodes with a combined model parameter of the s nodes.

In a second case, there are y new nodes, and when y≥s, if the y new nodes complete iteration in the process in which the model parameters of the s nodes completing iteration are combined, one node of the y new nodes is instructed to combine model parameters of the y nodes, and then combine a combined model parameter of the y nodes with a combined model parameter of the s nodes.

It should be noted that after the foregoing two cases, if the M nodes have a remaining node that has not participated in combination, the instruction module may instruct the remaining node to perform model parameter combination still by using the methods provided in the foregoing two cases, so as to improve efficiency of combining the model parameters of the M nodes. Certainly, combination may also be performed in another manner. This is not limited in this embodiment of the present invention.

In addition, one node of the new nodes may be a node with the smallest node number in the new nodes, or may be the last node completing iteration. This is not limited in this embodiment of the present invention.

Figure 6:
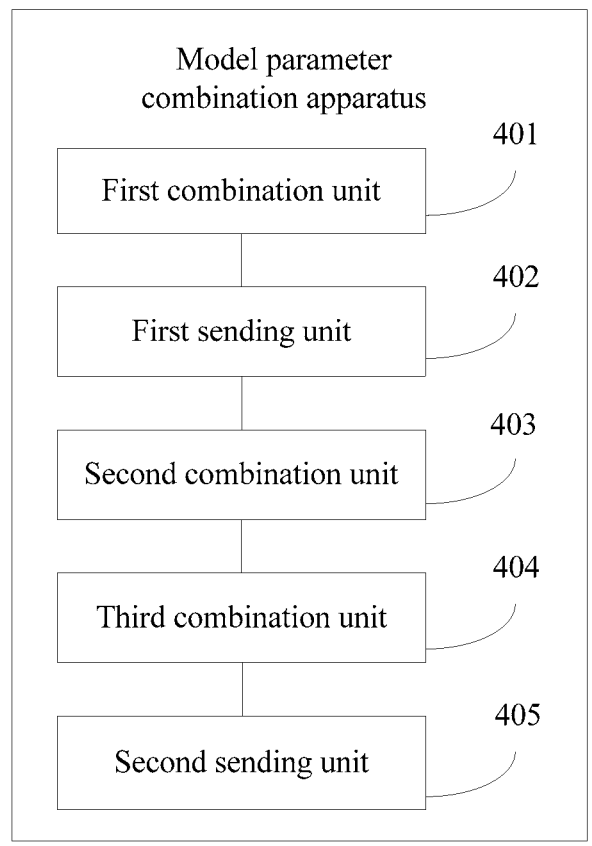
FIG. 6 is a schematic structural diagram of another model parameter combination apparatus according to an embodiment of the present invention.

Optionally, as shown in FIG. 6, the apparatus further includes a second combination unit 403, a third combination unit 404, and a second sending unit 405.

The second combination unit 403 is configured to: when W parameter collection groups meet an inter-group combination condition, separately combine all model parameters of nodes in each parameter collection group in the W parameter collection groups to obtain a second model parameter of each parameter collection group in the W parameter collection groups.

The W parameter collection groups are determined by upper-layer parameter collection groups of the W parameter collection groups, and W≤a total quantity of groups included in the upper-layer parameter collection groups.

The inter-group combination condition may be that a quantity of intra-group combination times of the parameter collection group reaches a preset quantity of times. Correspondingly, when a quantity of intra-group combination times of the W parameter collection groups reaches the preset quantity of times, each parameter collection group in the W parameter collection groups may send current model parameters to the second combination unit, so that the second combination unit combines all the current model parameters of all nodes in the parameter collection group to obtain a second model parameter, so as to obtain the second model parameter of each parameter collection group in the W parameter collection groups.

The third combination unit 404 is configured to combine second model parameters of all parameter collection groups in the W parameter collection groups to obtain a third model parameter.

The second sending unit 405 is configured to send the third model parameter to nodes in the W parameter collection groups or to nodes in upper-layer parameter delivery groups of the W parameter collection groups.

The second sending unit 405 may perform sending in a broadcast manner, or may perform sending in an iteration manner. That is, the second sending unit separately sends the third model parameter to a node in each parameter collection group included in the W parameter collection groups, so that the node sequentially sends the third model parameter to another node in the group in an iteration manner.

Then, the second sending unit may further send the third model parameter to a node in a parameter delivery group corresponding to each parameter collection group in the W parameter collection groups. A sending manner may be a broadcast manner or an iteration manner.

Optionally, the third combination unit 404 is specifically configured to:

determine, from the W parameter collection groups, one node as an inter-group combination node; and separately select one node from another parameter collection group in the W parameter collection groups except a parameter collection group in which the inter-group combination node is located, to send a second model parameter of the corresponding parameter collection group to the inter-group combination node, so that the inter-group combination node combines the second model parameters of the W parameter collection groups to obtain the third model parameter.

The inter-group combination node may be a node recommended by all nodes in the W parameter collection groups, or the first node completing iteration, or a node with the smallest node number. This is not limited in this embodiment of the present invention.

In addition, when the node is separately selected from the another parameter collection group in the W parameter collection groups except the parameter collection group in which the inter-group combination node is located, a node responsible for overall combination may be selected from the parameter collection group. Certainly, in actual application, the third combination unit may also select another node from another parameter collection group. This is not limited in this embodiment of the present invention.

Alternatively,

The third combination unit 404 is configured to: separately determine one node from each parameter collection group in the W parameter collection groups, and determine the determined nodes as a new parameter collection group; and when the new parameter collection group meets an intra-group combination condition, combine the second model parameters of the W parameter collection groups that meet the intra-group combination condition, to obtain the third model parameter.

It should be noted that the combining the second model parameters of the W parameter collection groups that meet the intra-group combination condition indicates combining the second model parameters of all the parameter collection groups in the W parameter collection groups.

In addition, when the node is determined from each parameter collection group in the W parameter collection groups, a node responsible for overall combination may be selected from each parameter collection group, or a node with the smallest number may be selected, or the like. This is not limited in the present invention.

Furthermore, a model parameter combination method for the new parameter collection group is similar to the intra-group combination method for the parameter collection group that meets the condition. Details are not described herein again in the present invention.

For example, a node responsible for overall intra-group combination may be separately selected from each parameter collection group in the W parameter collection groups to obtain W nodes. The W nodes are determined as the new parameter collection group. When the nodes in the new parameter collection group meet the intra-group combination condition, W second model parameters corresponding to the W nodes are combined in an intra-group combination manner. For example, when the intra-group combination condition is that a quantity of nodes completing overall combination reaches a preset quantity, if a quantity of nodes completing overall combination in the new parameter collection group reaches the preset quantity, combination of the nodes completing overall combination may be performed, and then a combined model parameter is combined with a model parameter of another node completing intra-group combination. Certainly, the W second model parameters corresponding to the W nodes may also be combined at one time. This is not limited in this embodiment of the present invention.

Optionally, the first sending unit 402 is specifically configured to:

send, in a broadcast manner to the nodes in the parameter delivery group corresponding to the parameter collection group that meets the condition, the first model parameter of the parameter collection group that meets the condition; or send, to a first node in the parameter delivery group corresponding to the parameter collection group that meets the condition, the first model parameter of the parameter collection group that meets the condition, so that the first node sequentially sends the first model parameter of the parameter collection group to another node in the N nodes except the first node in an iteration manner.

After the third model parameter is sent to the nodes in the W parameter collection groups, the third model parameter may be further sent to a node in a parameter delivery group corresponding to each parameter collection group in the W parameter collection groups, or may be sent to the nodes in the upper-layer parameter delivery groups of the W parameter collection groups by the last node performing combination.

Figure 7:
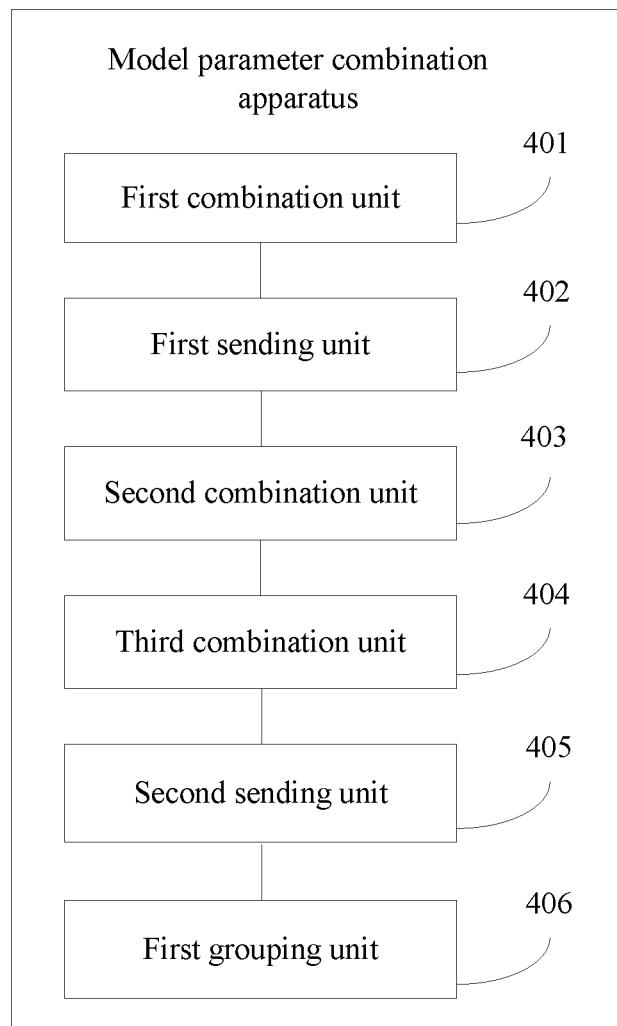
FIG. 7 is a schematic structural diagram of still another model parameter combination apparatus according to an embodiment of the present invention.

Optionally, as shown in FIG. 7, the apparatus further includes:

a first grouping unit 406, configured to: when a preset condition is met, regroup nodes included in the parameter collection group and the parameter delivery group.

The preset condition may be that a specific time passes, or model parameter combination is completed for a specific quantity of times, or iteration is completed for a specific quantity of times, or the like. This is not limited in this embodiment of the present invention.

In addition, the step of regrouping nodes included in the parameter collection group and the parameter delivery group may be performed by the node grouping apparatus provided in the fourth aspect of the present invention. Details are not described herein in the present invention.

Optionally, when the machine learning system further includes a parameter server, one parameter collection group and a parameter delivery group corresponding to the parameter collection group are corresponding to a same parameter server, and different parameter collection groups and corresponding parameter delivery groups are corresponding to different parameter servers.

Further, the parameter server includes Y layers. One parameter server of the $(j+1)^{th}$ layer is corresponding to at least one parameter server of the $j^{th}$ layer. The parameter collection group and the parameter delivery group corresponding to the parameter collection group are corresponding to a parameter server of the first layer, and $1 \leq j < j+1 \leq Y$.

Optionally, the first grouping unit is configured to: divide, based on a preset correspondence between a node identifier and a node number, a quantity of parameter collection groups, and a quantity of parameter delivery groups, a node number corresponding to a node identifier by the quantity of parameter collection groups, to obtain a collection group reminder of a node;

divide the node number corresponding to the node identifier by the quantity of parameter delivery groups, to obtain a delivery group remainder of the node; and determine nodes having a same collection group remainder as a same parameter collection group, and determine nodes having a same delivery group remainder as a same parameter delivery group.

Specifically, the regrouping nodes included in the parameter collection group and the parameter delivery group may be further performed by a node grouping apparatus provided in the following Embodiment 5. Details are not described herein in this embodiment of the present invention.

The model parameter combination apparatus provided in this embodiment of the present invention performs intra-group combination on a parameter collection group to obtain a first model parameter, and sends the first model parameter to a parameter delivery group corresponding to the parameter collection group; then, combines all first model parameters of each parameter collection group in W parameter collection groups to obtain a second model parameter; performs inter-group combination on the W parameter collection groups to obtain a third model parameter; and regroups nodes when a preset condition is met. Therefore, a problem that model parameter combination has a high performance requirement for a parameter server, a large data transmission volume, and a dynamic calculation resource adjustment is resolved.

Embodiment 5

This embodiment of the present invention provides a node grouping apparatus that is applied to a machine learning system. The machine learning system includes at least two nodes. The apparatus includes:

a second grouping unit, configured to group the nodes in the machine learning system, so that the machine learning system includes at least one parameter collection group and at least one parameter delivery group, each parameter collection group is corresponding to at least one parameter delivery group, and a node included in the at least one parameter collection group is different from a node included in a parameter delivery group corresponding to the parameter collection group.

That each parameter collection group is corresponding to at least one parameter delivery group indicates that one parameter collection group may be corresponding to one parameter delivery group or may be corresponding to multiple parameter delivery groups.

In addition, that a node included in the at least one parameter collection group is different from a node included in a parameter delivery group corresponding to the parameter collection group indicates that nodes included in the at least one parameter collection group are not exactly the same as nodes included in the corresponding parameter delivery group, or may indicate that at least one node included in the parameter collection group is different from a node included in the parameter delivery group corresponding to the parameter collection group, or may indicate that all nodes included in the parameter collection group are different from all nodes included in the parameter delivery group corresponding to the parameter collection group.

Optionally, different parameter collection groups have a same quantity of or different quantities of nodes; and/or different parameter delivery groups have a same quantity of or different quantities of nodes; and/or a quantity of nodes in a parameter collection group may be the same as or different from a quantity of nodes in a parameter delivery group corresponding to the parameter collection group.

Optionally, the machine learning system further includes a parameter server. A parameter collection group and a parameter delivery group corresponding to the parameter collection group are corresponding to a same parameter server. Different parameter collection groups and corresponding parameter delivery groups are corresponding to different parameter servers.

Optionally, the parameter server includes Y layers. One parameter server of the $(j+1)^{th}$ layer is corresponding to at least one parameter server of the $j^{th}$ layer. The parameter collection group and the parameter delivery group corresponding to the parameter collection group are corresponding to a parameter server of the first layer, and $1 \leq j < j+1 \leq Y$.

Further, when the parameter server includes Y layers, a quantity of parameter servers at each layer and a correspondence between a lower-layer parameter server and an upper-layer parameter server may be determined.

The correspondence between a lower-layer parameter server and an upper-layer parameter server may be set in advance, or may be determined in a node grouping process. For example, the correspondence between a lower-layer parameter server and an upper-layer parameter server may be determined by using the following method for determining a parameter collection group or a parameter delivery group. For a specific method, reference may be made to the following method for determining a parameter collection group or a parameter delivery group. Details are not described herein in this embodiment of the present invention.

Optionally, the second grouping unit specifically includes:

a first determining module, configured to determine a correspondence between a node identifier and a node number;

a second determining module, configured to determine a quantity of parameter collection groups and a quantity of parameter delivery groups;

a third determining module, configured to determine the parameter collection group and the parameter delivery group based on the correspondence between a node identifier and a node number, the quantity of parameter collection groups, and the quantity of parameter delivery groups; and a fourth determining module, configured to determine a correspondence between the parameter collection group and the parameter delivery group.

The node identifier is used to uniquely identify a node. For example, the node identifier may be an IP address of a node or a sequence code of a node. This is not limited in the present invention. The node number may be a sequence number randomly assigned to a node, or may be any value randomly assigned to a node, or the like. This is also not limited in the present invention.

When a preset condition is met, and regrouping is performed by using the node grouping method provided in this embodiment of the present invention, a node number of each node may change, the quantity of parameter collection groups and the quantity of parameter delivery groups may change, and the correspondence between the parameter collection group and the parameter delivery group may also change correspondingly.

Optionally, the third determining unit is specifically configured to:

divide a node number corresponding to a node identifier by the quantity of parameter collection groups, to obtain a collection group remainder of a node;

divide the node number corresponding to the node identifier by the quantity of parameter delivery groups, to obtain a delivery group remainder of the node; and determine nodes having a same collection group remainder as a same parameter collection group, and determine nodes having a same delivery group remainder as a same parameter delivery group.

The node grouping apparatus provided in this embodiment of the present invention groups nodes in a machine learning system, so that the machine learning system includes at least one parameter collection group and at least one parameter delivery group, each parameter collection group is corresponding to at least one parameter delivery group, and a node included in the at least one parameter collection group is different from a node included in a parameter delivery group corresponding to the parameter collection group. Therefore, a problem that model parameter combination has a high performance requirement for a parameter server, and a dynamic calculation resource adjustment is resolved.

Embodiment 6

Figure 8:
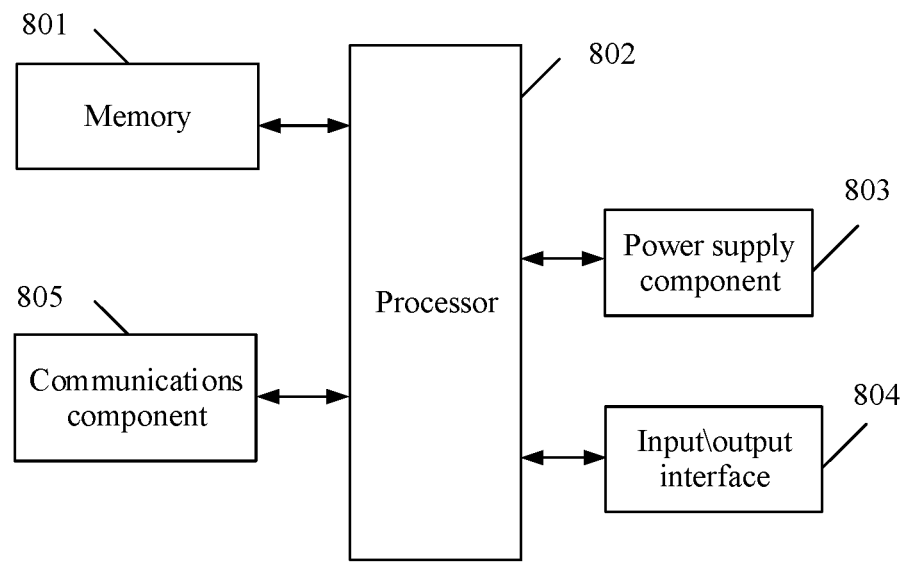
FIG. 8 is a schematic structural diagram of a model parameter combination apparatus according to an embodiment of the present invention.

FIG. 8 shows a model parameter combination apparatus according to an embodiment of the present invention. The model parameter combination apparatus includes a memory 801, a processor 802, a power supply component 803, an input/output interface 804, a communications component 805, and the like. The processor 802 is configured to perform the model parameter combination method described in the foregoing Embodiment 2.

Persons of ordinary skill in the art may understand that a structure shown in FIG. 8 is merely exemplary, and is not intended to limit the structure of the model parameter combination apparatus. For example, the model parameter combination apparatus may further include more or less components than those shown in FIG. 8, or have a configuration different from that shown in FIG. 8.

The following describes each component of the model parameter combination apparatus in detail.

The memory 801 may be configured to store data, a software program, and a module. The memory 801 mainly includes a program storage area and a data storage area. The program storage area may store an operating system, an application program required by at least one function, and the like. The data storage area may store data created according to use of the model parameter combination apparatus, and the like. In addition, the memory may include a high-speed random access memory, and may further include a nonvolatile memory such as at least one magnetic disk storage component, a flash memory component, or another volatile solid-state storage component.

The processor 802 is a control center of the model parameter combination apparatus and is connected to each part of the entire model parameter combination apparatus by using interfaces and lines. The processor 802 runs or executes the software program or the module or both stored in the memory 801, and invokes the data stored in the memory 801, to perform functions of the model parameter combination apparatus and process data, so as to monitor the entire model parameter combination apparatus. Optionally, the processor 802 may include one or more processing units. Preferably, an application processor and a modem processor may be integrated into the processor 802. The application processor mainly processes an operating system, a user interface, an application program, and the like. The modem processor mainly processes radio communications. It may be understood that the foregoing modem processor may not be integrated into the processor 802.

The power supply component 803 is configured to supply power to each component of the model parameter combination apparatus. The power supply component 803 may include a power management system, one or more power supplies, and another component related to generation, management, and power distribution of the model parameter combination apparatus.

The input \output interface 804 provides an interface between the processor 802 and a peripheral interface module. For example, the peripheral interface module may be a keyboard, a mouse, or the like.

The communications component 805 is configured for wired or wireless communication between the model parameter combination apparatus and another device. The model parameter combination apparatus may access a wireless network based on a communications standard such as WiFi, 2G, 3G, or a combination of WiFi, 2G, and 3G.

Although not shown, the model parameter combination apparatus may further include an audio component, a multimedia component, and the like. Details are not described herein in this embodiment of the present invention.

Optionally, the model parameter combination apparatus is a parameter server. The parameter server is disposed independently of the node, or is configured on the node.

The model parameter combination apparatus provided in this embodiment of the present invention performs intra-group combination on a parameter collection group to obtain a first model parameter, and sends the first model parameter to a parameter delivery group corresponding to the parameter collection group; then, combines all first model parameters of each parameter collection group in W parameter collection groups to obtain a second model parameter; performs inter-group combination on the W parameter collection groups to obtain a third model parameter; and regroups nodes when a preset condition is met. Therefore, a problem that model parameter combination has a high performance requirement for a parameter server, and a large data transmission volume is resolved.

Embodiment 7

Figure 9:
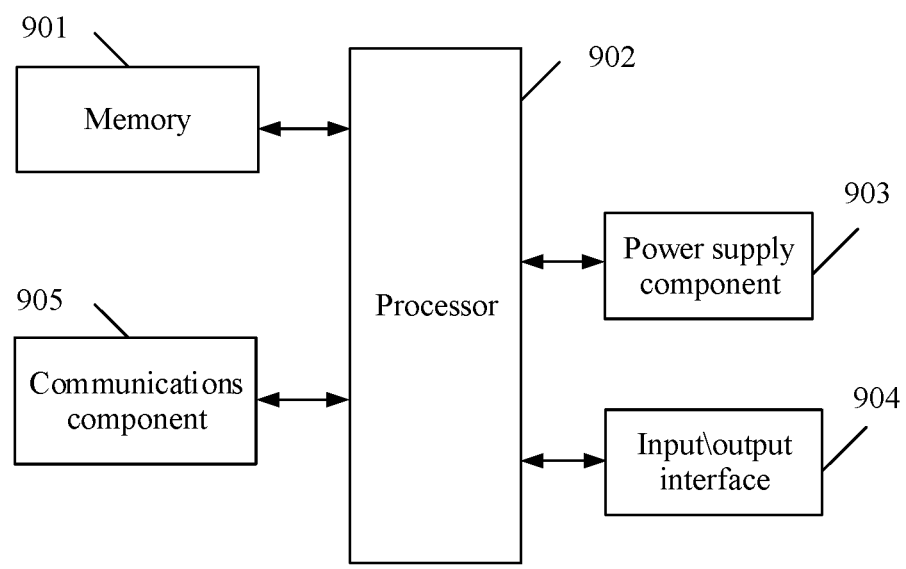
FIG. 9 is a schematic structural diagram of a controller according to an embodiment of the present invention.

FIG. 9 shows a model parameter combination apparatus according to an embodiment of the present invention. The model parameter combination apparatus includes a memory 901, a processor 902, a power supply component 903, an input\output interface 904, a communications component 905, and the like. The processor 902 is configured to perform the node grouping method described in the foregoing Embodiment 3.

Persons of ordinary skill in the art may understand that a structure shown in FIG. 9 is merely exemplary, and is not intended to limit the structure of a controller. For example, the controller may further include more or less components than those shown in FIG. 9, or have a configuration different from that shown in FIG. 9.

The following describes each component of the controller in detail.

The memory 901 may be configured to store data, a software program, and a module. The memory 901 mainly includes a program storage area and a data storage area. The program storage area can store an operating system, an application program required by at least one function, and the like. The data storage area can store data created according to use of the model parameter combination apparatus, and the like. In addition, the memory may include a high-speed random access memory, and may further include a nonvolatile memory such as at least one magnetic disk storage component, a flash memory component, or another volatile solid-state storage component.

The processor 902 is a control center of the controller and is connected to each part of the entire controller by using interfaces and lines. The processor 902 runs or executes the software program or the module or both stored in the memory 901, and invokes the data stored in the memory 901, to perform functions of the controller and process data, so as to monitor the entire controller. Optionally, the processor 902 may include one or more processing units. Preferably, an application processor and a modem processor may be integrated into the processor 902. The application processor mainly processes an operating system, a user interface, an application program, and the like. The modem processor mainly processes radio communications. It may be understood that the foregoing modem processor may not be integrated into the processor 902.

The power supply component 903 is configured to supply power to each component of the controller. The power supply component 903 may include a power management system, one or more power supplies, and another component related to generation, management, and power distribution of the controller.

The input\output interface 904 provides an interface between the processor 902 and a peripheral interface module. For example, the peripheral interface module may be a keyboard, a mouse, or the like.

The communications component 905 is configured for wired or wireless communication between the controller and another device. The controller may access a wireless network based on a communications standard such as WiFi, 2G, 3G, or a combination of WiFi, 2G, and 3G.

Although not shown, the controller may further include an audio component, a multimedia component, and the like. Details are not described herein in this embodiment of the present invention.

The controller provided in this embodiment of the present invention groups nodes in a machine learning system, so that the machine learning system includes at least one parameter collection group and at least one parameter delivery group, each parameter collection group is corresponding to at least one parameter delivery group, and a node included in the at least one parameter collection group is different from a node included in a parameter delivery group corresponding to the parameter collection group. Therefore, a problem that model parameter combination has a high performance requirement for a parameter server, and a dynamic calculation resource adjustment is resolved.

Embodiment 8

This embodiment of the present invention provides a machine learning system. The machine learning system includes the model parameter combination apparatus described in Embodiment 6 and the controller described in Embodiment 7.

According to the machine learning system provided in this embodiment of the present invention, a model parameter combination apparatus performs intra-group combination on a parameter collection group to obtain a first model parameter, and sends the first model parameter to a parameter delivery group corresponding to the parameter collection group; then, combines all first model parameters of each parameter collection group in W parameter collection groups to obtain a second model parameter; and performs inter-group combination on the W parameter collection groups to obtain a third model parameter. A controller regroups nodes in the parameter collection group and the parameter delivery group when a preset condition is met. Therefore, a problem that model parameter combination has a high performance requirement for a parameter server, a large data transmission volume, and a dynamic calculation resource adjustment is resolved.

Finally, it should be noted that the foregoing embodiments are merely intended for describing the technical solutions of the present invention but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present invention.

What is claimed is:

1. A model parameter combination method, wherein the method is applied to a machine learning system, the machine learning system comprises at least one parameter collection group and at least one parameter delivery group, each parameter collection group is corresponding to at least one parameter delivery group, each parameter collection group comprises at least one node, each parameter delivery group comprises at least one node, a node comprised in the at least one parameter collection group is different from a node comprised in a corresponding parameter delivery group, and the method comprises:

when any parameter collection group meets an intra-group combination condition, combining model parameters of M nodes in the parameter collection group that meets the condition, to obtain a first model parameter of the parameter collection group that meets the condition, wherein a smallest quantity s of combination nodes in the parameter collection group that meets the condition≤M≤a total quantity of nodes comprised in the parameter collection group that meets the condition; and sending, to N nodes in a parameter delivery group corresponding to the parameter collection group that meets the condition, the first model parameter of the parameter collection group that meets the condition, wherein 1≤N≤a total quantity of nodes comprised in the parameter delivery group corresponding to the parameter collection group that meets the condition.

2. The method according to claim 1, wherein:
the combining model parameters of M nodes in the parameter collection group that meets the condition, to obtain a first model parameter of the parameter collection group that meets the condition comprises:
receiving the model parameters of the M nodes that are sent by the M nodes completing iteration in the parameter collection group that meets the condition; and
combining the received model parameters of the M nodes to obtain the first model parameter of the parameter collection group that meets the condition.

3. The method according to claim 1, wherein:
the combining model parameters of M nodes in the parameter collection group that meets the condition, to obtain a first model parameter of the parameter collection group that meets the condition comprises:
obtaining node status information of the parameter collection group that meets the condition; and
instructing, according to the node status information of the parameter collection group that meets the condition, the M nodes completing iteration in the parameter collection group that meets the condition, to combine the model parameters to obtain the first model parameter of the parameter collection group that meets the condition.

4. The method according to claim 3, wherein the instructing, according to the node status information of the parameter collection group that meets the condition, the M nodes completing iteration in the parameter collection group that meets the condition, to combine the model parameters comprises:
determining, according to the node status information of the parameter collection group that meets the condition, s nodes completing iteration from the parameter collection group that meets the condition;
instructing one node of the s nodes completing iteration, to combine model parameters of the s nodes; and
if x new nodes complete iteration in a process in which the model parameters of the s nodes completing iteration are combined, instructing one node of the x new nodes to combine model parameters of the x new nodes with a combined model parameter of the s nodes, wherein x<s; or if y new nodes complete iteration in a process in which the model parameters of the s nodes completing iteration are combined, instructing one node of the y new nodes to combine model parameters of the y nodes, and then combine a combined model parameter of the y nodes with a combined model parameter of the s nodes, wherein y≥s.

5. The method according to any claim 1, wherein the method further comprises:
when W parameter collection groups meet an inter-group combination condition, separately combining model parameters of nodes in each parameter collection group in the W parameter collection groups to obtain a second model parameter of each parameter collection group in the W parameter collection groups;
combining second model parameters of all parameter collection groups in the W parameter collection groups to obtain a third model parameter; and
sending the third model parameter to nodes in the W parameter collection groups or to nodes in upper-layer parameter delivery groups of the W parameter collection groups.

6. The method according to claim 5, wherein the combining second model parameters of all parameter collection groups in the W parameter collection groups to obtain a third model parameter comprises:
determining, from the W parameter collection groups, one node as an inter-group combination node; and
separately selecting one node from another parameter collection group in the W parameter collection groups except a parameter collection group in which the inter-group combination node is located, to send a second model parameter of the corresponding parameter collection group to the inter-group combination node, so that the inter-group combination node combines the second model parameters of the W parameter collection groups to obtain the third model parameter; or, separately determining one node from each parameter collection group in the W parameter collection groups, and determining the determined nodes as a new parameter collection group; and
when the new parameter collection group meets an intra-group combination condition, combining the second model parameters of the W parameter collection groups that meet the intra-group combination condition, to obtain the third model parameter.

7. The method according to claim 1, wherein the sending, to N nodes in a parameter delivery group corresponding to the parameter collection group that meets the condition, the first model parameter of the parameter collection group that meets the condition comprises:
sending, in a broadcast manner to the nodes in the parameter delivery group corresponding to the parameter collection group that meets the condition, the first model parameter of the parameter collection group that meets the condition; or sending, to a first node in the parameter delivery group corresponding to the parameter collection group that meets the condition, the first model parameter of the parameter collection group that meets the condition, so that the first node sequentially sends, in an iteration manner to another node in the N nodes except the first node, the first model parameter of the parameter collection group that meets the condition.

8. The method according to claim 1, wherein the machine learning system further comprises a parameter server, one parameter collection group and a corresponding parameter delivery group are corresponding to a same parameter server, and different parameter collection groups and corresponding parameter delivery groups are corresponding to different parameter servers.

9. The method according to claim 8, wherein the parameter server comprises Y layers, one parameter server of the $(j+1)^{th}$ layer is corresponding to at least one parameter server of the $j^{th}$ layer, the parameter collection group and the parameter delivery group corresponding to the parameter collection group are corresponding to a parameter server of the first layer, and $1 \le j < j+1 \le Y$.

10. The method according to claim 1, wherein the method further comprises:
when a preset condition is met, regrouping nodes comprised in the parameter collection group and the parameter delivery group.

11. The method according to claim 10, wherein the regrouping nodes comprised in the parameter collection group and the parameter delivery group comprises:
- dividing, based on a preset correspondence between a node identifier and a node number, a quantity of parameter collection groups, and a quantity of parameter delivery groups, a node number corresponding to a node identifier by the quantity of parameter collection groups, to obtain a collection group remainder of a node;
- dividing the node number corresponding to the node identifier by the quantity of parameter delivery groups, to obtain a delivery group remainder of the node; and
- determining nodes having a same collection group remainder as a same parameter collection group, and determining nodes having a same delivery group remainder as a same parameter delivery group.

12. A model parameter combination apparatus, wherein the apparatus is applied to a machine learning system, the machine learning system comprises at least one parameter collection group and at least one parameter delivery group, each parameter collection group is corresponding to at least one parameter delivery group, each parameter collection group comprises at least one node, each parameter delivery group comprises at least one node, a node comprised in the at least one parameter collection group is different from a node comprised in a corresponding parameter delivery group, and the apparatus comprises:
- at least one processor; and
- a non-transitory computer-readable storage medium coupled to the at least one processor and storing programming instructions for execution by the at least one processor, wherein the programming instructions instruct the at least one processor to:
- when any parameter collection group meets an intra-group combination condition, combine model parameters of M nodes in the parameter collection group that meets the condition, to obtain a first model parameter of the parameter collection group that meets the condition, wherein a smallest quantity s of combination nodes in the parameter collection group that meets the condition≤M≤a total quantity of nodes comprised in the parameter collection group that meets the condition; and
- send, to N nodes in a parameter delivery group corresponding to the parameter collection group that meets the condition, the first model parameter of the parameter collection group that meets the condition, wherein 1≤N≤a total quantity of nodes comprised in the parameter delivery group corresponding to the parameter collection group that meets the condition.

13. The apparatus according to claim 12, the programming instructions instruct the at least one processor to:
- receive the model parameters of the M nodes that are sent by the M nodes completing iteration in the parameter collection group that meets the condition; and
- combine the received model parameters sent by the M nodes, to obtain the first model parameter of the parameter collection group that meets the condition.

14. The apparatus according to claim 12, the programming instructions instruct the at least one processor to:
- obtain node status information of the parameter collection group that meets the condition; and
- instruct, according to the node status information of the parameter collection group that meets the condition, the M nodes completing iteration in the parameter collection group that meets the condition, to combine the model parameters to obtain the first model parameter of the parameter collection group.

15. The apparatus according to claim 14, the programming instructions instruct the at least one processor to:
- determine, according to the node status information of the parameter collection group, s nodes completing iteration in the parameter collection group;
- instruct one node of the s nodes completing iteration, to combine model parameters of the s nodes; and
- if x new nodes complete iteration in a process in which the model parameters of the s nodes completing iteration are combined, instruct one node of the x new nodes to combine model parameters of the x new nodes with a combined model parameter of the s nodes, wherein x<s; or if y new nodes complete iteration in a process in which the model parameters of the s nodes completing iteration are combined, instruct one node of the y new nodes to combine model parameters of the y nodes, and then combine a combined model parameter of the y nodes with a combined model parameter of the s nodes, wherein y≥s.

16. The apparatus according to claim 12, the programming instructions instruct the at least one processor to:
- when W parameter collection groups meet an inter-group combination condition, separately combine all model parameters of nodes in each parameter collection group in the W parameter collection groups to obtain a second model parameter of each parameter collection group in the W parameter collection groups;
- combine second model parameters of all parameter collection groups in the W parameter collection groups to obtain a third model parameter; and
- send the third model parameter to nodes in the W parameter collection groups or to nodes in upper-layer parameter delivery groups of the W parameter collection groups.

17. The apparatus according to claim 16, the programming instructions instruct the at least one processor to:
- determine, from the W parameter collection groups, one node as an inter-group combination node; and
- separately select one node from another parameter collection group in the W parameter collection groups except a parameter collection group in which the inter-group combination node is located, to send a second model parameter of the corresponding parameter collection group to the inter-group combination node, so that the inter-group combination node combines the second model parameters of the W parameter collection groups to obtain the third model parameter; or, separately determine one node from each parameter collection group comprised in the W parameter collection groups, and determine the determined nodes as a new parameter collection group; and
- when the new parameter collection group meets an intra-group combination condition, combine the second model parameters of the W parameter collection groups that meet the intra-group combination condition, to obtain the third model parameter.

18. The apparatus according to claim 12, the programming instructions instruct the at least one processor to:
- send, in a broadcast manner, the first model parameter of the parameter collection group to the nodes in the parameter delivery group corresponding to the parameter collection group that meets the condition; or
- send, to a first node in the parameter delivery group corresponding to the parameter collection group that meets the condition, the first model parameter of the parameter collection group that meets the condition, so that the first node sequentially sends, in an iteration manner to another node in the N nodes except the first node, the first model parameter of the parameter collection group that meets the condition.

19. The apparatus according to claim 12, wherein the machine learning system further comprises a parameter server, one parameter collection group and a corresponding parameter delivery group are corresponding to a same parameter server, and different parameter collection groups and corresponding parameter delivery groups are corresponding to different parameter servers.

20. The apparatus according to claim 19, wherein the parameter server comprises Y layers, one parameter server of the $(j+1)^{th}$ layer is corresponding to at least one parameter server of the $j^{th}$ layer, the parameter collection group and the parameter delivery group corresponding to the parameter collection group are corresponding to a parameter server of the first layer, and $1 \leq j < j+1 \leq Y$.

21. The apparatus according to claim 12, the programming instructions instruct the at least one processor to:
when a preset condition is met, regroup nodes comprised in the parameter collection group and the parameter delivery group.

22. The apparatus according to claim 21, the programming instructions instruct the at least one processor to:
divide, based on a preset correspondence between a node identifier and a node number, a quantity of parameter collection groups, and a quantity of parameter delivery groups, a node number corresponding to a node identifier by the quantity of parameter collection groups, to obtain a collection group remainder of a node;
divide the node number corresponding to the node identifier by the quantity of parameter delivery groups, to obtain a delivery group remainder of the node; and
determine nodes having a same collection group remainder as a same parameter collection group, and determine nodes having a same delivery group remainder as a same parameter delivery group.

23. A model parameter combination apparatus, wherein the model parameter combination apparatus comprises a processor and a memory, the memory stores code and data, the processor can run the code in the memory, and the processor is configured to perform the model parameter combination method according to any one of the foregoing claim 1.

24. The apparatus according to claim 23, wherein the model parameter combination apparatus is a parameter server, and the parameter server is disposed independently of the node or is configured on the node.

* * * * *